(12) United States Patent
Saito et al.

(10) Patent No.: US 11,428,757 B2
(45) Date of Patent: *Aug. 30, 2022

(54) EXCHANGE-COUPLING FILM AND MAGNETORESISTIVE ELEMENT AND MAGNETIC DETECTOR USING THE SAME

(71) Applicant: Alps Alpine Co., Ltd., Tokyo (JP)

(72) Inventors: Masamichi Saito, Miyagi-ken (JP); Hiroaki Endo, Miyagi-ken (JP); Fumihito Koike, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 215 days.

This patent is subject to a terminal disclaimer.

(21) Appl. No.: 16/816,957

(22) Filed: Mar. 12, 2020

(65) Prior Publication Data

US 2020/0284857 A1 Sep. 10, 2020

Related U.S. Application Data

(63) Continuation of application No. PCT/JP2018/030751, filed on Aug. 21, 2018.

(30) Foreign Application Priority Data

Sep. 27, 2017 (JP) .............................. JP2017-186544
Feb. 8, 2018 (JP) .............................. JP2018-021263

(51) Int. Cl.
*G01R 33/09* (2006.01)
*H01F 10/30* (2006.01)

(52) U.S. Cl.
CPC ......... *G01R 33/093* (2013.01); *G01R 33/091* (2013.01); *H01F 10/30* (2013.01)

(58) Field of Classification Search
CPC .......................... G01R 33/098; G01R 33/093
See application file for complete search history.

(56) References Cited

U.S. PATENT DOCUMENTS 6,790,541 B2    9/2004 Saito et al.
7,023,670 B2 *  4/2006 Saito .................... G11B 5/3903
                                                      360/324.12

(Continued)

FOREIGN PATENT DOCUMENTS

JP    2000-215431    8/2000
JP    2001-297917    10/2001

(Continued)

*Primary Examiner* — Alesa Allgood
(74) *Attorney, Agent, or Firm* — Crowell & Moring LLP

(57) ABSTRACT

An exchange-coupling film having a large magnetic field (Hex) at which the magnetization direction of a pinned magnetic layer is reversed, thus exhibiting high stability under high-temperature conditions, and having excellent high-magnetic-field resistance includes an antiferromagnetic layer and a pinned magnetic layer in contact with the antiferromagnetic layer. The antiferromagnetic layer has an alternating multilayer structure of three or more layers, the layers including alternately stacked $X^1Cr$ and $X^2Mn$ layers, where $X^1$ represents one or more elements selected from the group consisting of platinum group elements and Ni, and $X^2$ represents one or more elements selected from the group consisting of platinum group elements and Ni and may be the same as or different from $X^1$.

16 Claims, 26 Drawing Sheets

(56) References Cited

U.S. PATENT DOCUMENTS

| | | | |
|---|---|---|---|
| 2002/0018919 A1 | 2/2002 | Saito et al. | |
| 2003/0103299 A1 | 6/2003 | Saito | |
| 2004/0134877 A1* | 7/2004 | Ishiwata | H01F 41/308 |
| | | | 216/22 |
| 2016/0341802 A1 | 11/2016 | Koike et al. | |
| 2020/0319273 A1* | 10/2020 | Saito | G01R 33/09 |
| 2020/0319274 A1* | 10/2020 | Saito | H01F 10/30 |

FOREIGN PATENT DOCUMENTS

| | | |
|---|---|---|
| JP | 2003-338644 | 11/2003 |
| JP | 2016-217920 | 12/2016 |

* cited by examiner

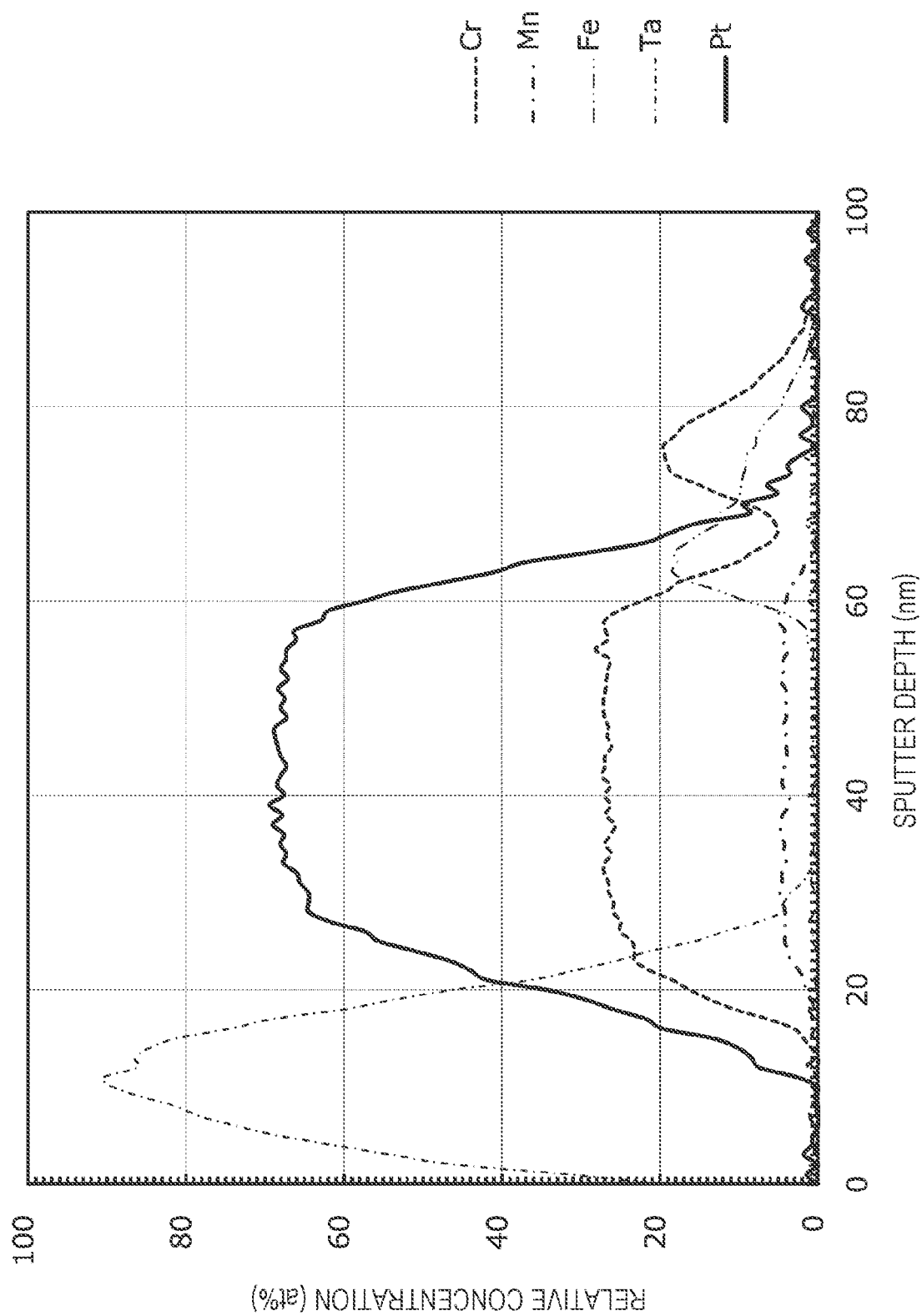

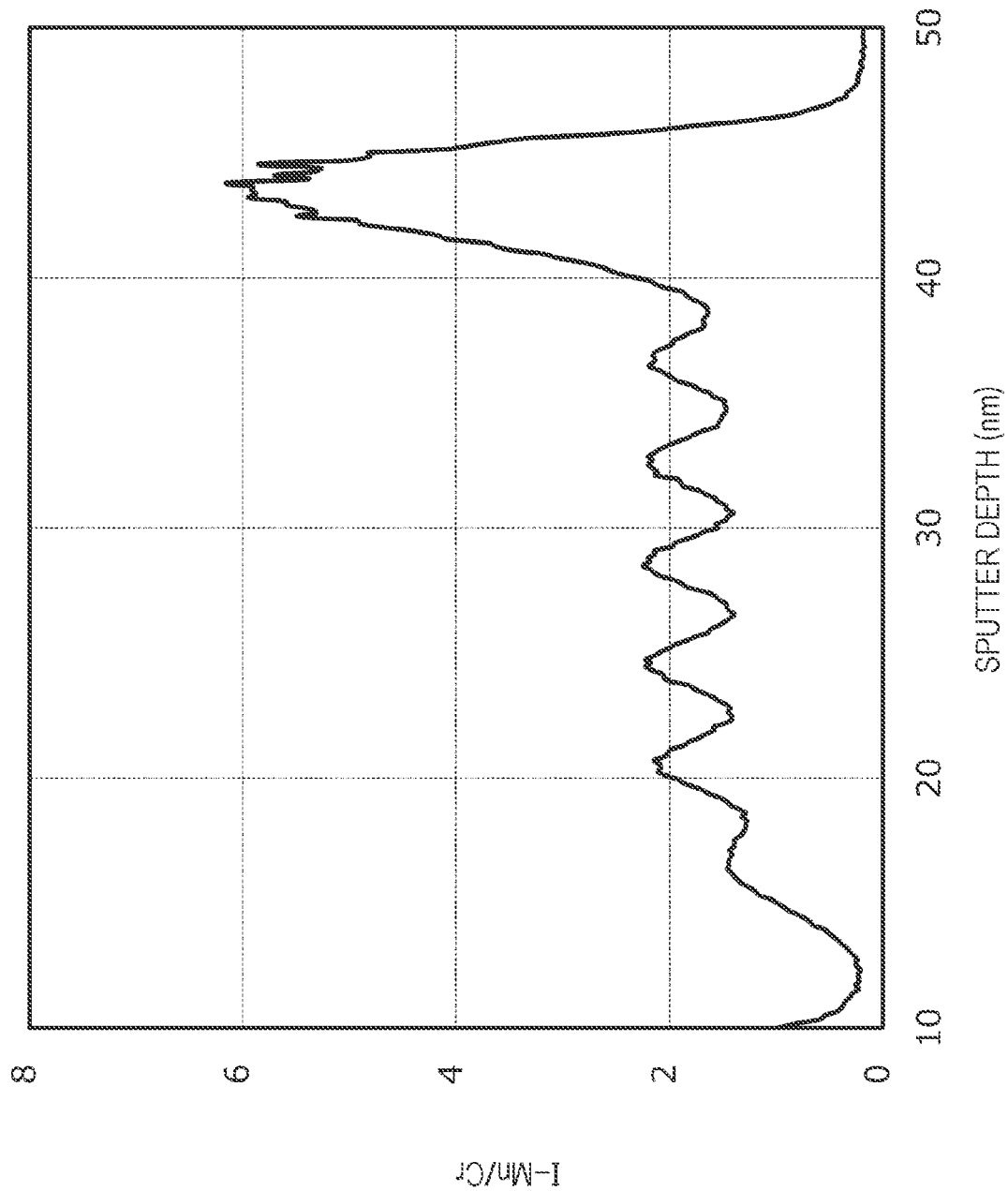

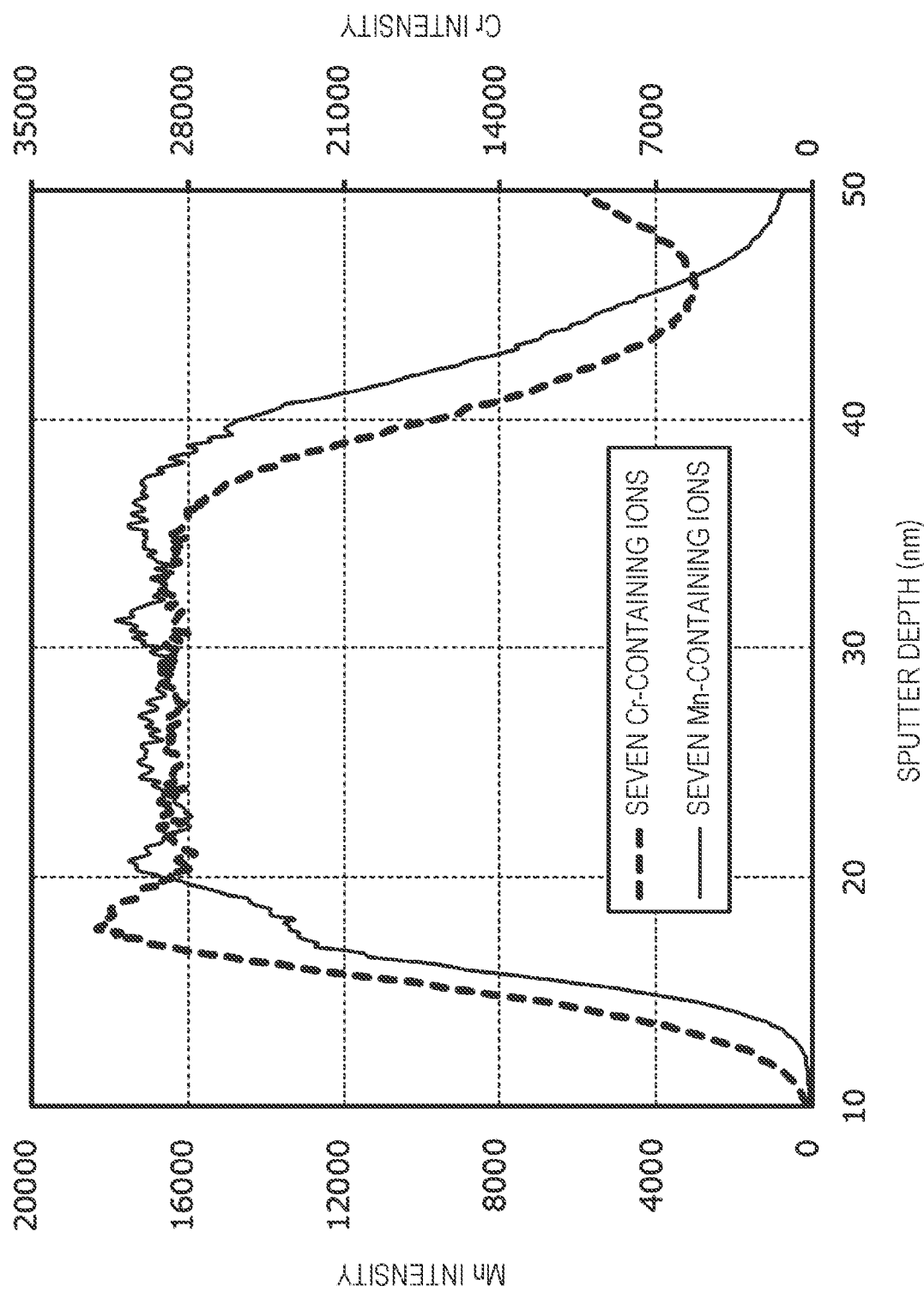

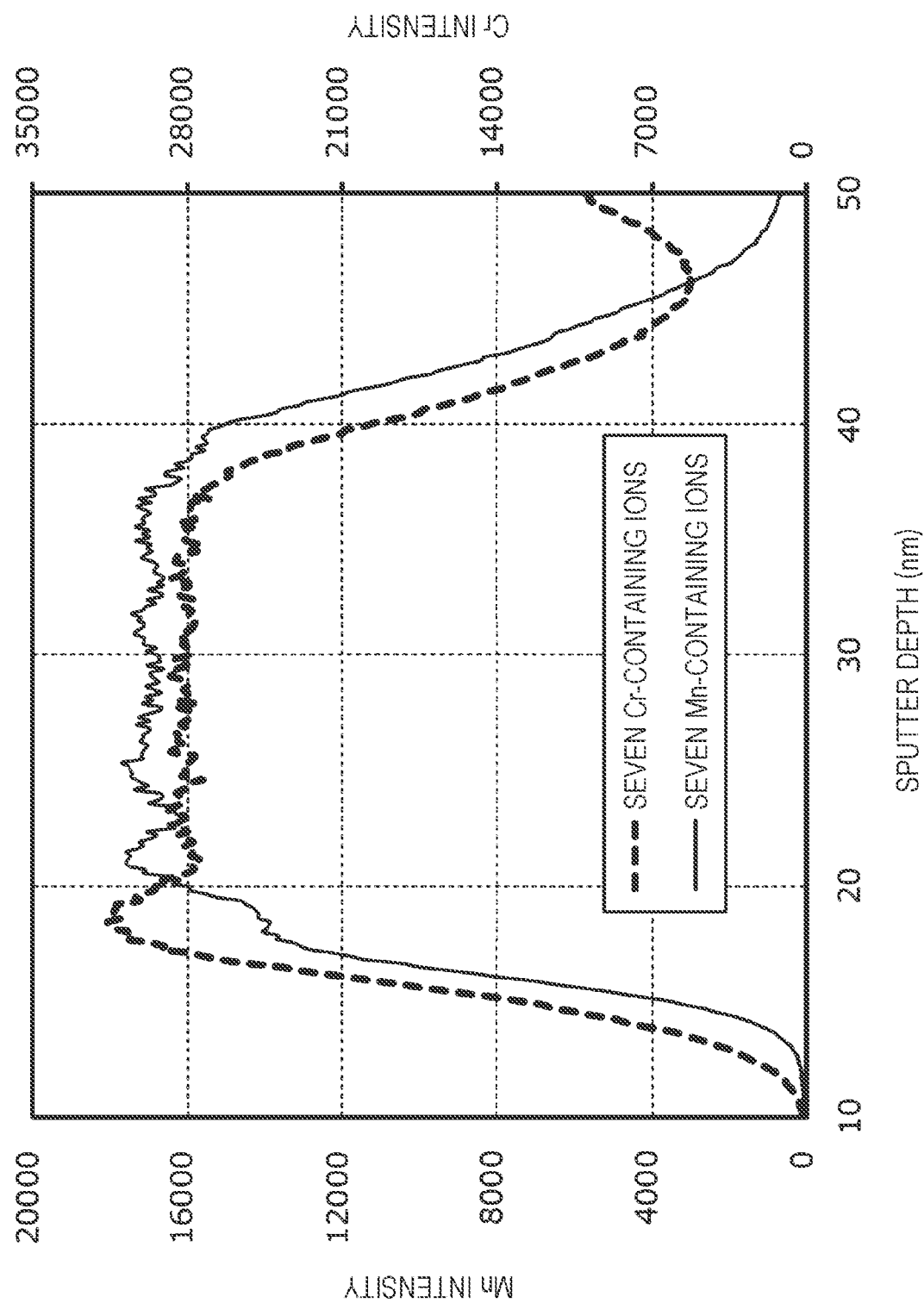

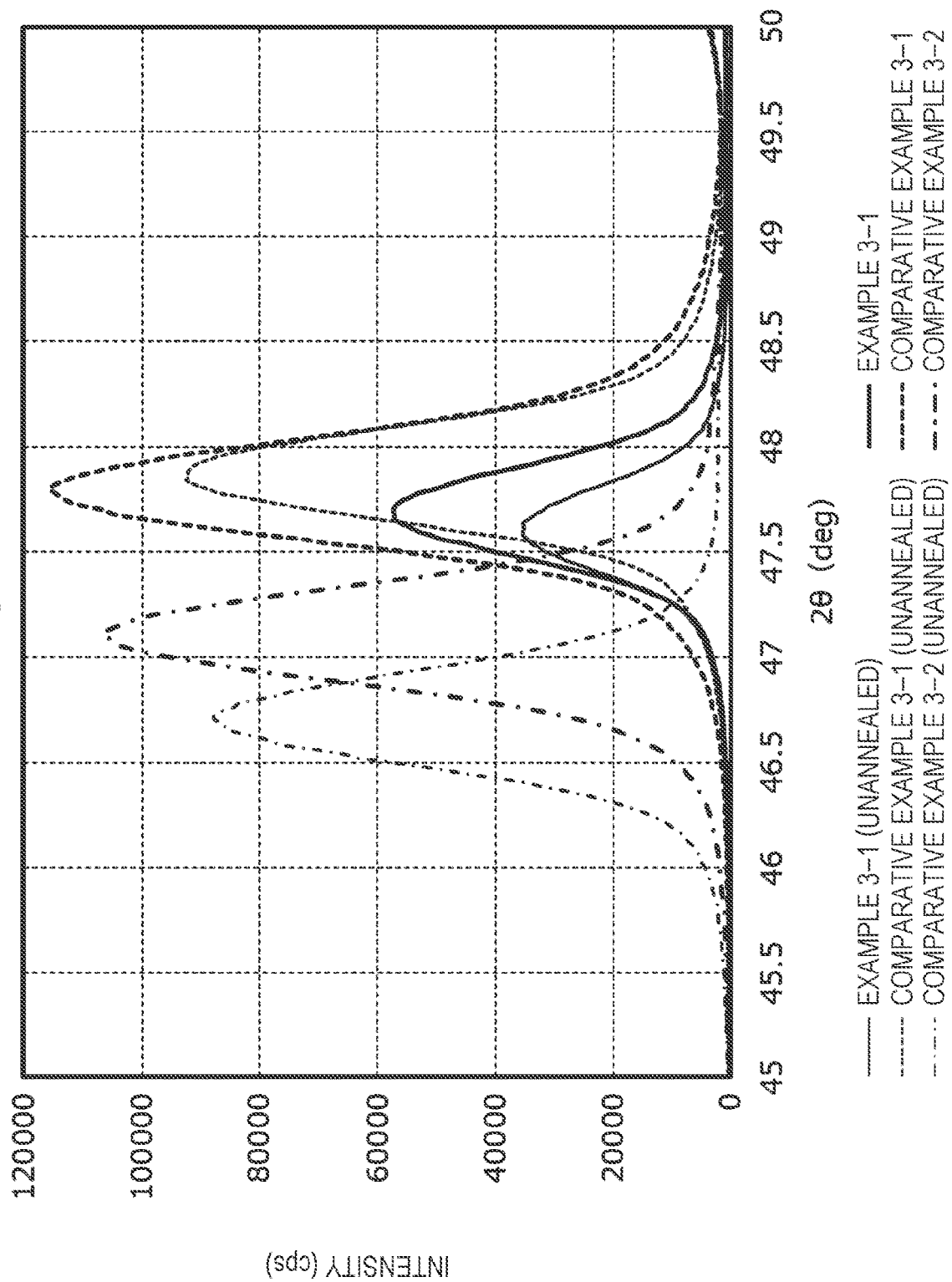

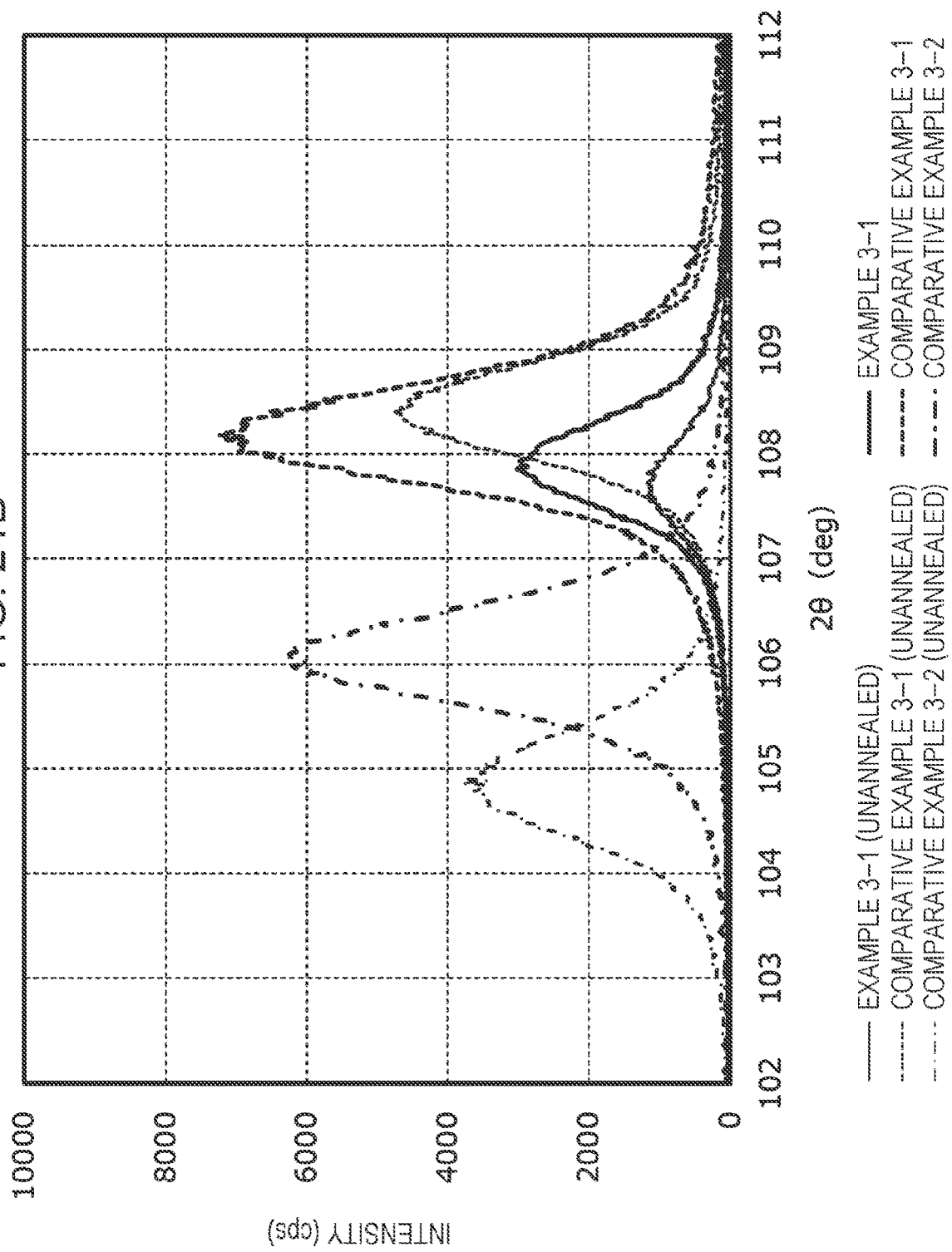

EXCHANGE-COUPLING FILM AND MAGNETORESISTIVE ELEMENT AND MAGNETIC DETECTOR USING THE SAME

CLAIM OF PRIORITY

This application is a Continuation of International Application No. PCT/JP2018/030751 filed on Aug. 21, 2018, which claims benefit of priority to Japanese Patent Application No. 2017-186544 filed on Sep. 27, 2017 and No. 2018-021263 filed on Feb. 8, 2018). The entire contents of each application noted above are hereby incorporated by reference.

BACKGROUND

1. Field of the Disclosure

The present disclosure relates to an exchange-coupling film and to a magnetoresistive element and a magnetic detector using the exchange-coupling film.

2. Description of the Related Art

An exchange-coupling film including an antiferromagnetic layer and a pinned magnetic layer may be used as a magnetoresistive element or a magnetic detector. Japanese Unexamined Patent Application Publication No. 2000-215431 discloses that an exchange-coupling film for a magnetic recording medium can be formed by combining a Co alloy serving as a ferromagnetic layer with various alloys serving as an antiferromagnetic layer. Examples presented for the antiferromagnetic layer, include alloys such as CoMn, NiMn, PtMn, and PtCr.

A magnetic detector requires a solder reflow process (melting process) when a magnetoresistive element is mounted on a substrate. A magnetic detector may be used in a high-temperature environment such as in the vicinity of an engine. Thus, to enable magnetic field detection in a wide dynamic range, an exchange-coupling film used for a magnetic detector preferably has a large magnetic field (Hex) at which the magnetization direction of a pinned magnetic layer is reversed and thus has high stability under high-temperature conditions.

Japanese Unexamined Patent Application Publication No. 2000-215431 relates to an exchange-coupling film for use as a magnetic recording medium and does not describe the stability of a magnetic detector using an exchange-coupling film under high-temperature conditions.

Furthermore, recently, it has been found desirable that the magnetization direction of a pinned magnetic layer be less affected in an environment in which the magnetic detector is disposed near a source of a high magnetic field, such as a high-power motor, and a high magnetic field is applied thereto; that is, high-magnetic-field resistance has been required.

SUMMARY

The present invention provides an exchange-coupling film having a large magnetic field (Hex) at which the magnetization direction of a pinned magnetic layer is reversed, thus exhibiting high stability under high-temperature conditions, and having excellent high-magnetic-field resistance. The present invention also provides a magnetoresistive element and a magnetic detector using the exchange-coupling film.

In one aspect, an exchange-coupling film includes an antiferromagnetic layer and a pinned magnetic layer in contact with the antiferromagnetic layer. The antiferromagnetic layer has an alternating multilayer structure of three or more layers, the layers including alternately stacked $X^1Cr$ and $X^2Mn$ layers, where $X^1$ represents one or more elements selected from the group consisting of platinum group elements and Ni, and $X^2$ represents one or more elements selected from the group consisting of platinum group elements and Ni and may be the same as or different from $X^1$.

In the exchange-coupling film according to the present invention, M0/Ms is a negative value, and the absolute value thereof can be made larger. Thus, the exchange-coupling film according to the present invention has excellent high-magnetic-field resistance. Furthermore, because the exchange-coupling film according to the present invention includes an antiferromagnetic layer having an alternating multilayer structure of three or more layers, the layers including alternately stacked $X^1Cr$ and $X^2Mn$ layers, Hex in a high-temperature environment is particularly larger. Thus, the exchange-coupling film according to the present invention has excellent high-magnetic-field resistance in a high-temperature environment.

In another aspect, an exchange-coupling film includes an antiferromagnetic layer and a pinned magnetic layer in contact with the antiferromagnetic layer. The antiferromagnetic layer includes an X(Cr—Mn) layer containing Mn, Cr, and one or more elements X selected from the group consisting of platinum group elements and Ni. The antiferromagnetic layer has a first region closer to the pinned magnetic layer and a second region farther away from the pinned magnetic layer. A Mn content in the first region is higher than a Mn content in the second region. Mn is contained in the entire second region.

In still another aspect, a magnetoresistive element includes the above-described exchange-coupling film and a free magnetic layer that are stacked.

Even still another aspect of the present invention provides a magnetic detector including at least one magnetoresistive element.

BRIEF DESCRIPTION OF THE DRAWINGS

FIG. 15 is a depth profile of a multilayer structure of Example 2-5;

FIG. 16B is a depth profile of I—Mn/Cr for the multilayer structure of Example 2-1;

FIG. 17A is a depth profile of the total detected intensity of seven Mn-containing ions and the total detected intensity of seven Cr-containing ions for the exchange-coupling film of Example 2-1;

FIG. 19A is a depth profile of the total detected intensity of seven Mn-containing ions and the total detected intensity of seven Cr-containing ions for the exchange-coupling film of Example 2-5;

FIG. 21A is an enlarged X-ray diffraction spectrum of FIG. 20 in a 2θ range of 45 to 50 degrees; and FIG. 21B is an enlarged X-ray diffraction spectrum of FIG. 20 in a 2θ range of 102 to 112 degrees.

DESCRIPTION OF THE EXEMPLARY EMBODIMENTS

First Embodiment

Figure 1:
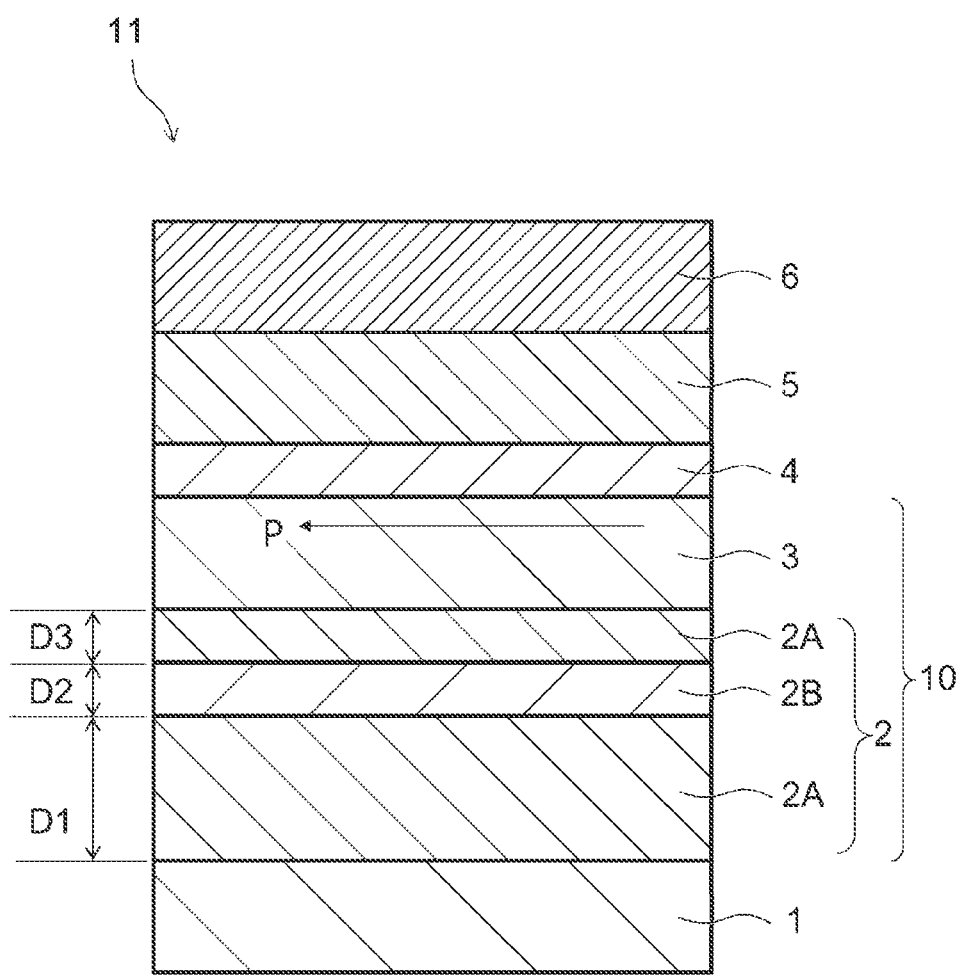
FIG. 1 is a diagram illustrating the film structure of an exchange-coupling film 10 according to a first embodiment of the present invention.

FIG. 1 illustrates the film structure of a magnetic detection element 11 using an exchange-coupling film 10 according to a first embodiment of the present invention.

The magnetic detection element 11 is formed by stacking an underlayer 1, an antiferromagnetic layer 2, a pinned magnetic layer 3, a non-magnetic material layer 4, a free magnetic layer 5, and a protection layer 6 in this order from a surface of a substrate.

The antiferromagnetic layer 2 is an alternating multilayer structure of three layers, the layers including alternately stacked $X^1Cr$ and $X^2Mn$ layers 2A and 2B, where $X^1$ and $X^2$ each represent one or more elements selected from the group consisting of platinum group elements and Ni, and $X^1$ and $X^2$ may be the same as or different from one another. These layers 2A and 2B are deposited, for example, through a sputtering process or a chemical vapor deposition (CVD) process. The antiferromagnetic layer 2 and the pinned magnetic layer 3 form the exchange-coupling film 10 according to the first embodiment of the present invention.

The magnetic detection element 11 is a multilayer element exploiting a so-called single spin-valve giant magnetoresistance effect (GMR effect), where electrical resistance changes according to the relative relationship between the vector of the pinned magnetization of the pinned magnetic layer 3 and the vector of the magnetization of the free magnetic layer 5, which changes according to an external magnetic field.

The underlayer 1 is formed of a NiFeCr alloy (nickel-iron-chromium alloy), Cr, Ta, or the like. A NiFeCr alloy is preferable to achieve a high magnetic field (hereafter, also referred to as "Hex" where appropriate) at which the magnetization direction of the pinned magnetic layer 3 is reversed in the exchange-coupling film 10 according to the present embodiment.

FIG. 1 illustrates an antiferromagnetic layer 2 having a three-layer structure of an $X^1Cr$ layer 2A, an $X^2Mn$ layer 2B, and an $X^1Cr$ layer 2A stacked in this order, where one of the $X^1Cr$ layers 2A is in contact with the pinned magnetic layer 3, as an aspect of an alternating multilayer structure of three or more layers, the layers including alternately stacked $X^1Cr$ and $X^2Mn$ layers 2A and 2B. However, the three-layer structure may be constituted by an $X^2Mn$ layer 2B, an $X^1Cr$ layer 2A, and an $X^2Mn$ layer 2B stacked in this order, where the $X^1Cr$ and $X^2Mn$ layers 2A and 2B are interchanged. In this three-layer structure, one of the $X^2Mn$ layers 2B is in contact with the pinned magnetic layer 3. An embodiment where the antiferromagnetic layer 2 is constituted by four or more layers will be described later.

To achieve a high Hex, when one of the $X^1Cr$ layers 2A is in contact with the pinned magnetic layer 3, the film thickness D1 of the $X^1Cr$ layer 2A on a side closer to the underlayer 1 is preferably larger than the film thickness D3 of the $X^1Cr$ layer 2A in contact with the pinned magnetic layer 3. Furthermore, the film thickness D1 of one of the $X^1Cr$ layers 2A of the antiferromagnetic layer 2 is preferably larger than the film thickness D2 of the $X^2Mn$ layer 2B. The ratio of the film thickness D1 to the film thickness D2 (D1:D2) is more preferably 5:1 to 100:1, even more preferably 10:1 to 50:1. The ratio of the film thickness D1 to the film thickness D3 (D1:D3) is more preferably 5:1 to 100:1, even more preferably 10:1 to 50:1.

When the three-layer structure is constituted by an $X^2Mn$ layer 2B in contact with the pinned magnetic layer 3, an $X^1Cr$ layer 2A, and an $X^2Mn$ layer 2B stacked in this order, the $X^2Mn$ layer 2B in contact with the pinned magnetic layer 3 and the $X^2Mn$ layer 2B on a side closer to the underlayer 1 may have the same film thickness D2.

In view of achieving a high Hex, X1 contained in the X1Cr layer 2A is preferably Pt, and $X^2$ contained in the $X^2Mn$ layer 2B is preferably Pt or Ir, more preferably Pt. When the $X^1Cr$ layer 2A is a PtCr layer, $Pt_XCr_{100-X}$ (where X is 45 at % to 62 at %) is preferable, and $Pt_XCr_{100-X}$ (where X is 50 at % to 57 at %) is more preferable. From the same point of view, the $X^2Mn$ layer 2B is preferably a PtMn layer.

In the present embodiment, the antiferromagnetic layer 2 is ordered by annealing to generate exchange coupling (at the interface) with the pinned magnetic layer 3. The magnetic field resulting from exchange coupling (exchange-coupling magnetic field) enables the exchange-coupling film 10 to achieve a high Hex and to have improved high-magnetic-field resistance. In view of stably realizing the generation of exchange coupling by this ordering, the total content of the element $X^1$ and the element $X^2$ in the entire antiferromagnetic layer 2 is preferably 30 at % or more, more preferably 40 at % or more, and particularly preferably 45 at % or more.

The pinned magnetic layer 3 is formed of Fe (iron), Co (cobalt), a CoFe alloy (cobalt-iron alloy), or a NiFe alloy (nickel-iron alloy). CoFe alloys and NiFe alloys have higher coercivity as they have a higher Fe content. The pinned magnetic layer 3 is a layer contributing to a spin-valve giant magnetoresistance effect, and the direction in which the pinned magnetization direction P of the pinned magnetic layer 3 extends is the direction of the axis of sensitivity of the magnetic detection element 11.

The exchange-coupling film 10 can achieve a high Hex regardless of the Fe content in the pinned magnetic layer 3. This is because the antiferromagnetic layer 2, which has the above-described multilayer structure, exchange-couples with various ferromagnetic materials.

In view of magnetostriction, design constraints on the exchange-coupling film 10 may arise. However, because the antiferromagnetic layer 2 of the exchange-coupling film 10 exchange-couples with various ferromagnetic materials, a high Hex is achievable regardless of the composition of the alloy used for the pinned magnetic layer 3. Thus, because various metals and alloys can be used for the pinned magnetic layer 3, the exchange-coupling film 10 is advantageous in that it enables a wide range of choice of usable materials and greater design freedom than in the related art.

The non-magnetic material layer 4 can be formed of Cu (copper), Ru (ruthenium), or the like.

Any material or structure may be used for the free magnetic layer 5, but examples of the material for use include CoFe alloys (cobalt-iron alloys) and NiFe alloys (nickel-iron alloys), and the structure for use may be a single layer structure, a multilayer structure, or a multilayer ferri-structure.

The Protection Layer 6 can be Formed of Ta (Tantalum) or the Like.

When an alloy layer such as the $X^1$Cr layer 2A of the exchange-coupling film 10 is deposited, the plurality of metals forming the alloy ($X^1$ and Cr in the case of the $X^1$Cr layer 2A) may be provided simultaneously or alternately. A specific example of the former process is simultaneous sputtering of the plurality of metals forming the alloy, while a specific example of the latter process is alternate stacking of different metal films. In some cases, simultaneous provision of the plurality of metals forming the alloy may be more preferable than the alternate provision thereof in view of achieving a higher Hex.

Second Embodiment

Figure 2:
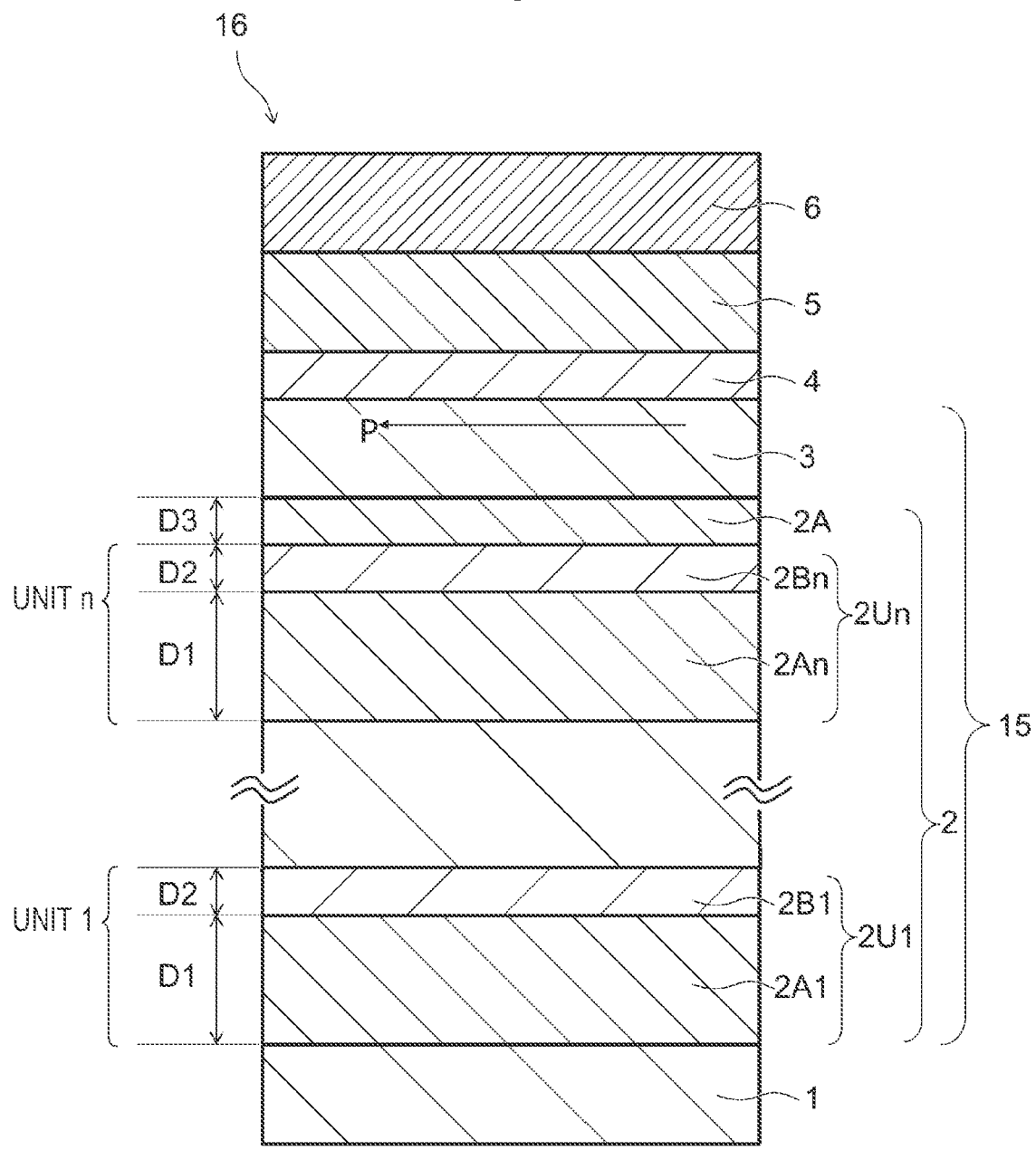
FIG. 2 is a diagram illustrating the film structure of an exchange-coupling film 15 according to a second embodiment of the present invention.

FIG. 2 is a diagram illustrating the film structure of a magnetic detection element (magnetoresistive element) 16 using an exchange-coupling film 15 according to a second embodiment of the present invention. In the present embodiment, layers having identical functions to those of the magnetic detection element 11 in FIG. 1 are denoted by the same references as used in FIG. 1, and descriptions thereof will be omitted.

The magnetic detection element 16 in FIG. 2 according to the second embodiment differs from the magnetic detection element 11 in FIG. 1 in that the antiferromagnetic layer 2 is constituted by four or more layers and includes a plurality of unit stacks, each formed of a unit of the $X^1$Cr and $X^2$Mn layers 2A and 2B (see FIG. 1). FIG. 2 illustrates the antiferromagnetic layer 2 including n unit stacks 2U1 to 2Un (where n represents an integer of 2 or more), the unit stack 2U1 being constituted by an $X^1$Cr layer 2A1 and an $X^2$Mn layer 2B1 and the unit stack 2Un being constituted by an $X^1$Cr layer 2An and an $X^2$Mn layer 2Bn.

In the unit stacks 2U1 to 2Un, the $X^1$Cr layer 2A1, . . . , the $X^1$Cr layer 2An all have the same film thickness D1, and the $X^2$Mn layer 2B1, . . . , the $X^2$Mn layer 2Bn also all have the same film thickness D2. By stacking the unit stacks 2U1 to 2Un having the same structure, the high-temperature stability of the antiferromagnetic layer 2 is improved.

The antiferromagnetic layer 2 in FIG. 2 is constituted by the unit stacks 2U1 to 2Un and the $X^1$Cr layer 2A, and the $X^1$Cr layer 2A is in contact with the pinned magnetic layer 3, but the antiferromagnetic layer 2 may be constituted by only the unit stacks 2U1 to 2Un. In the antiferromagnetic layer 2 constituted by only the unit stacks 2U1 to 2Un, the $X^2$Mn layer 2Bn is in contact with the pinned magnetic layer 3.

The number of unit stacks 2U1 to 2Un can be set depending on the size of the antiferromagnetic layer 2, the size of the film thickness D1, and the size of the film thickness D2. For example, when the film thickness D2 is 5 to 15 Å and the film thickness D1 is 30 to 40 Å, the number of unit stacks 2U1 to 2Un is preferably 3 to 15, more preferably 5 to 12, to achieve a high Hex in a high-temperature environment.

Third Embodiment

Figure 3:
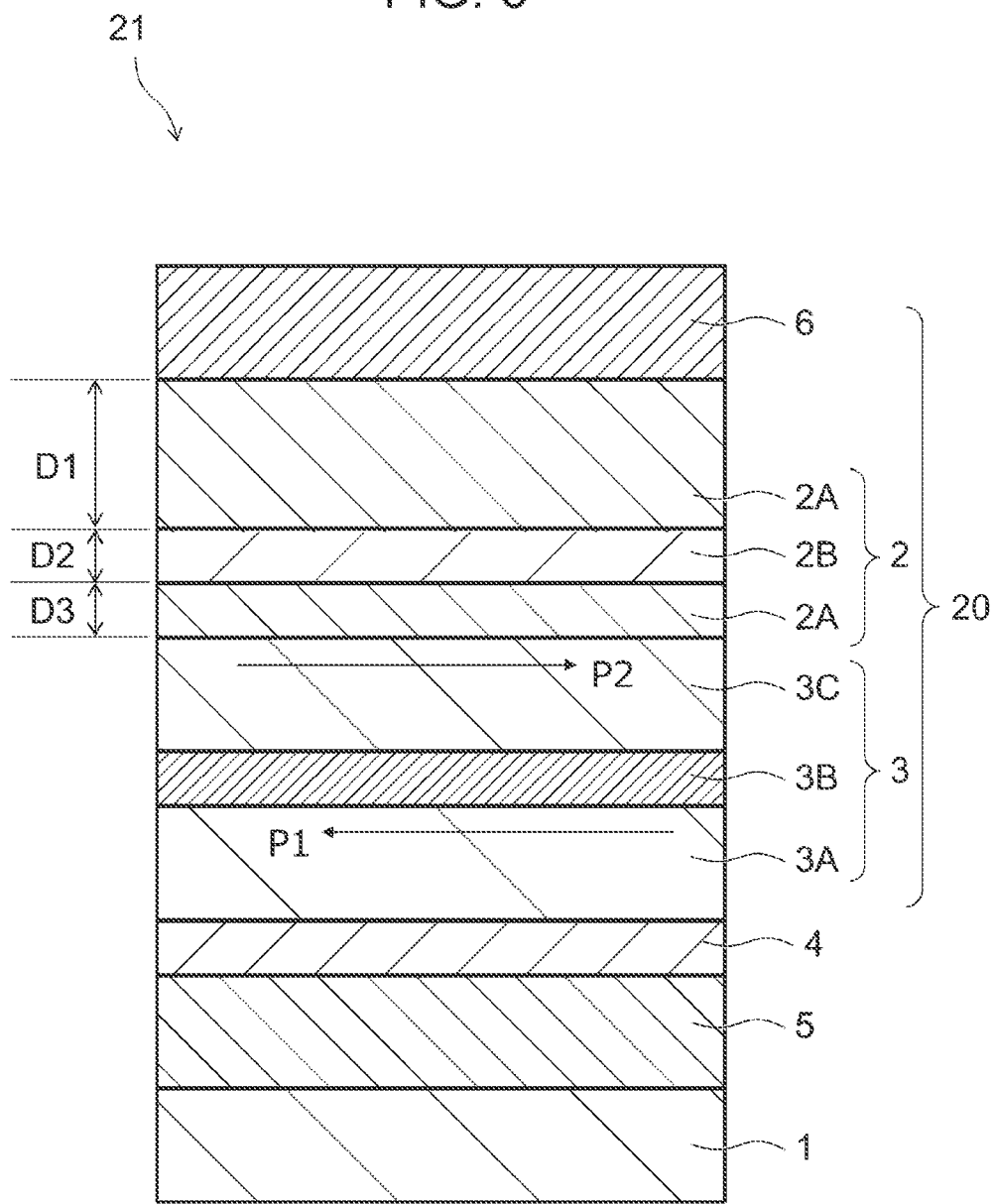
FIG. 3 is a diagram illustrating the film structure of an exchange-coupling film 20 according to a third embodiment of the present invention.

FIG. 3 is a diagram illustrating the film structure of a magnetic detection element (magnetoresistive element) 21 using an exchange-coupling film 20 according to a third embodiment of the present invention. In the present embodiment, layers having functions identical to those of the magnetic detection element 11 in FIG. 1 are denoted by the same references as used in FIG. 1, and descriptions thereof will be omitted.

The magnetic detection element 21 in FIG. 3 according to the third embodiment differs from the magnetic detection element 11 in FIG. 1 in that the exchange-coupling film 20 is configured such that a pinned magnetic layer 3 having a self-pinned structure is joined to the antiferromagnetic layer 2, and that the non-magnetic material layer 4 and the free magnetic layer 5 are formed on a side closer to the underlayer 1 than the pinned magnetic layer 3.

The antiferromagnetic layer 2 of the exchange-coupling film 20 in the present embodiment has an alternating multilayer structure of three layers as in the case of the exchange-coupling film 10 (see FIG. 1), but may have an alternating multilayer structure of four or more layers. For example, in place of the alternating multilayer structure of three layers, an alternating multilayer structure including a plurality of stacked units of the $X^1$Cr and $X^2$Mn layers 2A and 2B may be used.

The magnetic detection element 21 also is a multilayer element exploiting a so-called single spin-valve giant magnetoresistance effect. In the magnetic detection element 21, electrical resistance changes according to the relative relationship between the vector of the pinned magnetization of a first magnetic layer 3A of the pinned magnetic layer 3 and the vector of the magnetization of the free magnetic layer 5, which changes according to an external magnetic field.

The pinned magnetic layer 3 has a self-pinned structure constituted by the first magnetic layer 3A, a second magnetic layer 3C, and a non-magnetic intermediate layer 3B interposed between the two layers 3A and 3C. The pinned magnetization direction P1 of the first magnetic layer 3A and the pinned magnetization direction P2 of the second magnetic layer 3C are antiparallel with each other due to an interaction therebetween. The pinned magnetization direction P1 of the first magnetic layer 3A, which is adjacent to the non-magnetic material layer 4, is the pinned magnetization direction of the pinned magnetic layer 3. The direction in which this pinned magnetization direction P1 extends is the direction of the axis of sensitivity of the magnetic detection element 21.

The first magnetic layer 3A and the second magnetic layer 3C are formed of Fe (iron), Co (cobalt), a CoFe alloy (cobalt-iron alloy), or a NiFe alloy (nickel-iron alloy). CoFe alloys and NiFe alloys have higher coercivity as they have a higher Fe content. The first magnetic layer 3A, which is adjacent to the non-magnetic material layer 4, is a layer contributing to a spin-valve giant magnetoresistance effect.

The non-magnetic intermediate layer 3B is formed of Ru (ruthenium) or the like. The film thickness of a non-magnetic intermediate layer 3B formed of Ru is preferably 3 to 5 Å or 8 to 10 Å.

Thus, because of the wide range of choice of materials usable as the first magnetic layer 3A and the second magnetic layer 3C of the pinned magnetic layer 3 having a self-pinned structure according to the present embodiment, the exchange-coupling film 20, as in the case of the first embodiment, enables greater design freedom than in the related art.

Configuration of Magnetic Sensor

Figure 4:
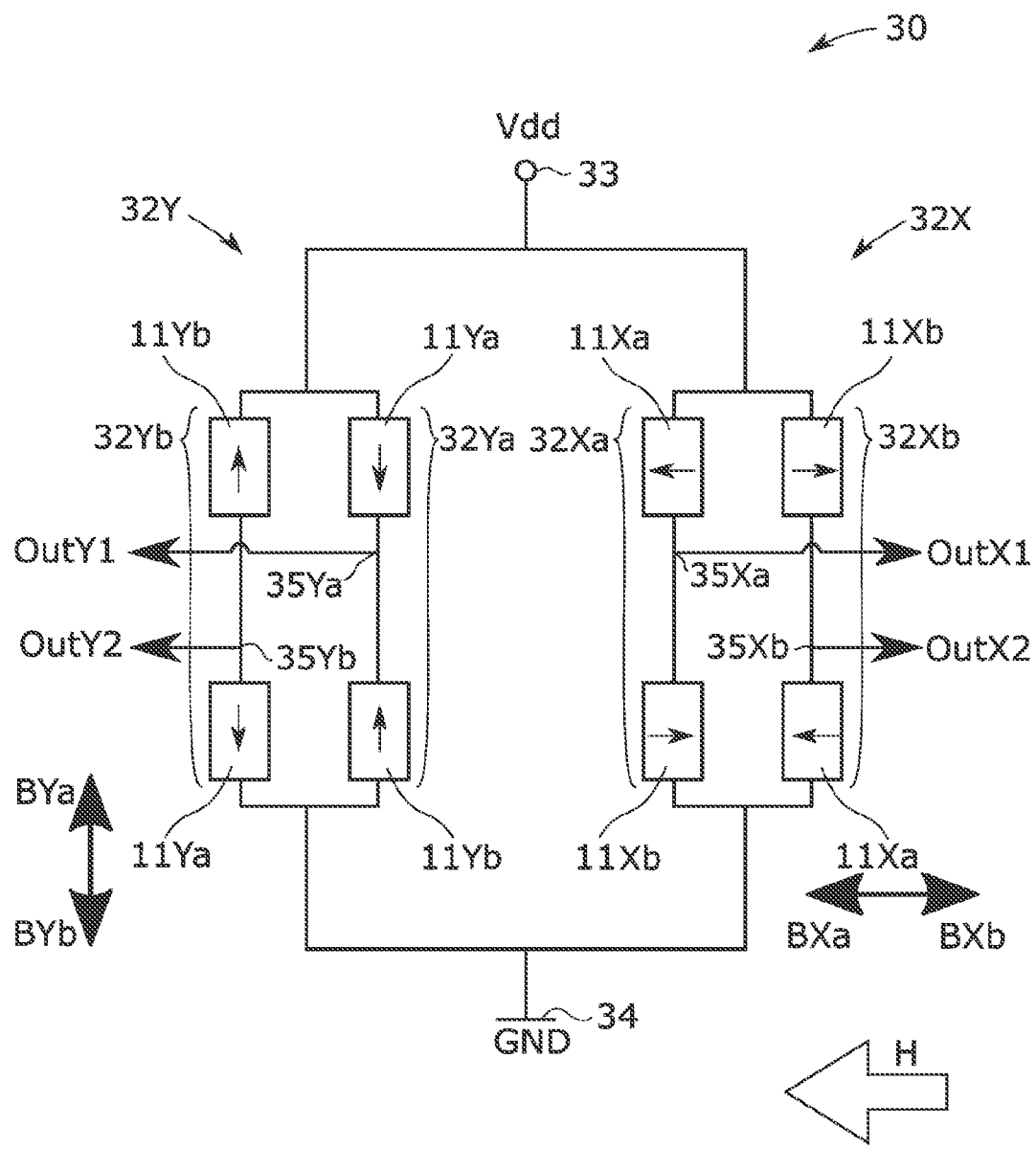
FIG. 4 is a circuit block diagram of a magnetic sensor 30 according to an embodiment of the present invention.

FIG. 4 illustrates a magnetic sensor (magnetic detector) 30 in combination with the magnetic detection element 11 in FIG. 1. In FIG. 4, magnetic detection elements 11 having different pinned magnetization directions P (see FIG. 1) are denoted by different reference numerals, namely, 11Xa, 11Xb, 11Ya, and 11Yb, for the sake of distinction. In the magnetic sensor 30, the magnetic detection elements 11Xa, 11Xb, 11Ya, and 11Yb are disposed on the same substrate.

The magnetic sensor 30 in FIG. 4 includes a full-bridge circuit 32X and a full-bridge circuit 32Y. The magnetic sensor 30 in FIG. 4 includes a plurality of magnetic detection elements 11 (see FIG. 1) on the same substrate. The full-bridge circuit 32X includes two magnetic detection elements 11Xa and two magnetic detection elements 11Xb. The full-bridge circuit 32Y includes two magnetic detection elements 11Ya and two magnetic detection elements 11Yb. The magnetic detection elements 11Xa, 11Xb, 11Ya, and 11Yb each have the film structure of the exchange-coupling film 10 of the magnetic detection element 11 in FIG. 1. Where appropriate, these magnetic detection elements 11Xa, 11Xb, 11Ya, and 11Yb will be hereafter referred to as magnetic detection elements 11 when no distinction is made therebetween.

The magnetic detection elements 11 used in the full-bridge circuit 32X and the full-bridge circuit 32Y have different pinned magnetization directions as indicated by arrows in FIG. 4 so that the circuits 32X and 32Y have different detected magnetic field directions. However, the circuits 32X and 32Y employ the same mechanism for magnetic field detection. Hereafter, the mechanism for magnetic field detection will be described with reference to the full-bridge circuit 32X.

The full-bridge circuit 32X is configured such that a first series portion 32Xa and a second series portion 32Xb are connected in parallel. The first series portion 32Xa is configured such that one of the magnetic detection elements 11Xa and one of the magnetic detection elements 11Xb are connected in series. The second series portion 32Xb is configured such that the other magnetic detection element 11Xb and the other magnetic detection element 11Xa are connected in series.

A power supply voltage Vdd is applied to a power supply terminal 33 shared by the magnetic detection element 11Xa constituting the first series portion 32Xa and the magnetic detection element 11Xb constituting the second series portion 32Xb. A ground terminal 34 shared by the magnetic detection element 11Xb constituting the first series portion 32Xa and the magnetic detection element 11Xa constituting the second series portion 32Xb is set to a ground potential GND.

The differential output (OutX1)–(OutX2) between the output potential (OutX1) at a midpoint 35Xa of the first series portion 32Xa constituting the full-bridge circuit 32X and the output potential (OutX2) at a midpoint 35Xb of the second series portion 32Xb constituting the full-bridge circuit 32X is obtainable as the detection output (the detection output voltage) VXs in the X direction.

The full-bridge circuit 32Y acts in the same way as the full-bridge circuit 32X, and the differential output (OutY1)–(OutY2) between the output potential (OutY1) at a midpoint 35Ya of the first series portion 32Ya and the output potential (OutY2) at a midpoint 35Yb of the second series portion 32Yb is obtainable as the detection output (the detection output voltage) VYs in the Y direction.

As indicated by the arrows in FIG. 4, the direction of the axis of sensitivity of the magnetic detection elements 11Xa and the magnetic detection elements 11Xb constituting the full-bridge circuit 32X and the direction of the axis of sensitivity of the magnetic detection elements 11Ya and the magnetic detection elements 11Yb constituting the full-bridge circuit 32Y are perpendicular to each other.

In the magnetic sensor 30 in FIG. 4, the direction of the free magnetic layer 5 of each of the magnetic detection elements 11 changes so as to be parallel with the direction of an external magnetic field H. At this time, resistance changes according to the relationship between the vector of the pinned magnetization direction P of the pinned magnetic layer 3 and the vector of the magnetization direction of the free magnetic layer 5.

For example, when the external magnetic field H acts in the direction as indicated in FIG. 4, the electrical resistance of the magnetic detection elements 11Xa constituting the full-bridge circuit 32X decreases because the direction of the axis of sensitivity and the direction of the external magnetic field H match. On the other hand, the electrical resistance of the magnetic detection elements 11Xb increases because the direction of the axis of sensitivity and the direction of the external magnetic field H are opposed to each other. According to this change in electrical resistance, the detection output voltage VXs=(OutX1)–(OutX2) is maximized. The detection output voltage VXs decreases as the direction of the external magnetic field H changes toward the right with respect to the page. Furthermore, the detection output voltage VXs decreases to zero when the external magnetic field H is directed upward or downward with respect to the page of FIG. 4.

On the other hand, in the full-bridge circuit 32Y, when the external magnetic field H is directed toward the left with respect to the page as indicated in FIG. 4, the magnetization direction of the free magnetic layer 5 is perpendicular to the direction of the axis of sensitivity (the pinned magnetization direction P) in all the magnetic detection elements 11; thus, the electrical resistance of the magnetic detection element 11Ya and the electrical resistance of the magnetic detection element 11Xb are the same. Accordingly, the detection output voltage VXs is zero. In FIG. 4, when the external magnetic field H acts downward with respect to the page, the detection output voltage of the full-bridge circuit 32Y, VYs=(OutY1)–(OutY2), is maximized, and the detection output voltage VYs decreases as the direction of the external magnetic field H changes upward with respect to the page.

Thus, when the direction of the external magnetic field H changes, the detection output voltage VXs of the full-bridge circuit 32X and the detection output voltage VYs of the full-bridge circuit 32Y change accordingly. Thus, the direction and the amount of the movement (the relative position) of the detection target are detectable on the basis of the detection output voltage VXs obtained from the full-bridge circuit 32X and the detection output voltage VYs obtained from the full-bridge circuit 32Y.

FIG. 4 illustrates the magnetic sensor 30 configured to detect a magnetic field in the X direction and a magnetic field in the Y direction perpendicular to the X direction. However, the magnetic sensor 30 may include only the full-bridge circuit 32X that detects only a magnetic field in the X direction or only the full-bridge circuit 32Y that detects only a magnetic field in the Y direction.

Figure 5:
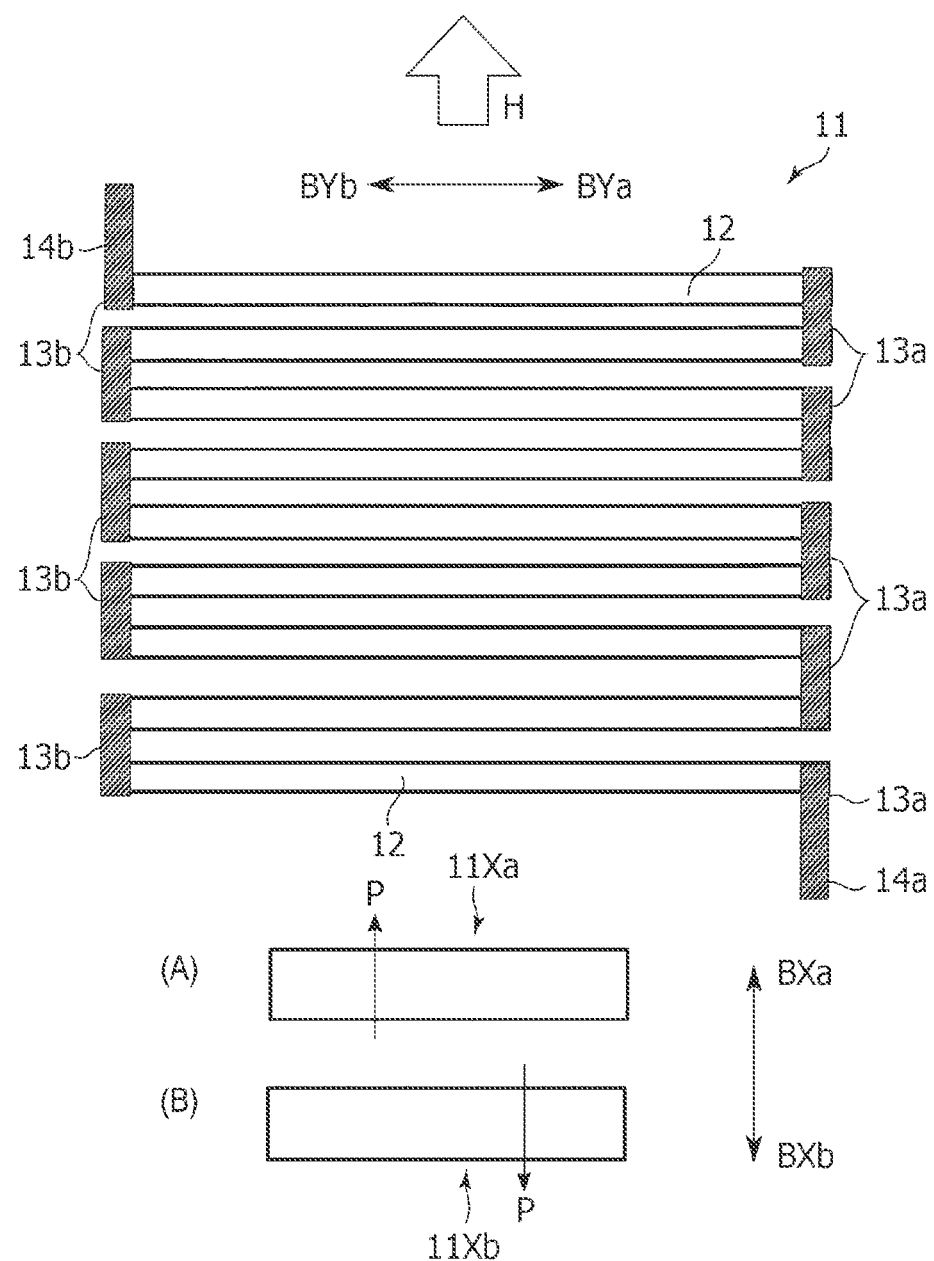
FIG. 5 is a plan view of a magnetic detection element 11 used in the magnetic sensor 30.

FIG. 5 illustrates the planar structures of the magnetic detection elements 11Xa and the magnetic detection elements 11Xb. In FIGS. 4 and 5, the BXa-BXb direction is the X direction. In (A) and (B) of FIG. 5, the pinned magnetization direction P of the magnetic detection elements 11Xa and the pinned magnetization direction P of the magnetic detection elements 11Xb are indicated by arrows. The pinned magnetization direction P of the magnetic detection elements 11Xa and the pinned magnetization direction P of the magnetic detection elements 11Xb are the X direction and are opposed to each other.

As illustrated in FIG. 5, the magnetic detection elements 11Xa and the magnetic detection elements 11Xb each have element portions 12 arranged in a striped pattern. The longitudinal direction of the element portions 12 is parallel with the BYa-BYb direction. A plurality of element portions 12 are disposed in parallel, and the right ends, as illustrated in the figure, of the element portions 12 that are positioned side-by-side are connected via conductive portions 13a, and the left ends, as illustrated in the figure, of the element portions 12 that are positioned side-by-side are connected via conductive portions 13b. The conductive portions 13a and the conductive portions 13b are connected in a staggered manner to the right ends, as illustrated in the figure, and to the left ends, as illustrated in the figure, of the element portions 12; that is, the element portions 12 are linked so as to form a so-called meandering shape. In the magnetic detection elements 11Xa and the magnetic detection elements 11Xb, the conductive portion 13a at the lower right portion as illustrated in the figure is integrated with a connecting terminal 14a, and the conductive portion 13b at the upper left portion as illustrated in the figure is integrated with a connecting terminal 14b.

Each of the element portions 12 is formed by stacking a plurality of metal layers (alloy layers). FIG. 1 illustrates the multilayer structure of each of the element portions 12. Each of the element portions 12 may have the multilayer structure in FIG. 2 or the multilayer structure in FIG. 3.

In the magnetic sensor 30 in FIGS. 4 and 5, the magnetic detection elements 11 can each be replaced with the magnetic detection element 16 according to the second embodiment illustrated in FIG. 2 or with the magnetic detection element 21 according to the third embodiment illustrated in FIG. 3.

While the embodiments have been described above, these examples do not limit the present invention. Appropriate additions, deletions, design modifications to the components of the above-described embodiments made by those skilled in the art and appropriate combinations of the features of the examples illustrated in the embodiments made by those skilled in the art are also included in the scope of the present invention as long as they capture the spirit of the present invention. For example, the antiferromagnetic layer 2 may include a layer other than the $X^1Cr$ layer 2A1 and the $X^2Mn$ layer 2B1 as long as the antiferromagnetic layer 2 can appropriately exercise the function thereof. As a specific example, the antiferromagnetic layer 2 may include a Mn layer as a layer closest to the pinned magnetic layer 3.

EXAMPLES

Example 1

An exchange-coupling film having the following structure was formed and annealed for 20 hours at a temperature of 350° C. and with a magnetic field strength of 15 kOe to pin the magnetization of the pinned magnetic layer 3 and the antiferromagnetic layer 2 (see FIG. 2). In the Examples, Comparative Examples, and Reference Examples below, numerical values enclosed within parentheses denote film thickness (Å).

Substrate
Underlayer 1: NiFeCr (42)
Non-magnetic material layer 4: Cu (40)/Ru (20)
Pinned magnetic layer 3: $Co_{90at\%}Fe_{10at\%}$ (100)
Antiferromagnetic layer 2:
$X^1Cr$ layer 2A: $Pt_{51at\%}Cr_{49at\%}$ (6)
Unit stacks 2U1 to 2U7: seven stacks of $Pt_{48at\%}Mn_{52at\%}$ (6)/$Pt_{51at\%}Cr_{49at\%}$ (34)
Protection layer 6: Ta (90)

Comparative Example 1

An exchange-coupling film in which the antiferromagnetic layer 2 of Example 1 was replaced with a $Pt_{48at\%}Mn_{52at\%}$ (300) layer was formed and annealed for four hours with the temperature of Example 1 changed from 350° C. to 290° C. and with a magnetic field strength of 15 kOe to pin the magnetization of the pinned magnetic layer and the antiferromagnetic layer.

Comparative Example 2

An exchange-coupling film in which the antiferromagnetic layer 2 of Example 1 was replaced with a $Pt_{51at\%}Cr_{49at\%}$ (300) layer was formed and annealed, as in the case of Example 1, for 20 hours at a temperature of 350° C. and with a magnetic field strength of 15 kOe to pin the magnetization of the pinned magnetic layer and the antiferromagnetic layer.

Table 1 presents the measurement results of the relationship between the temperature and the Hex and normalized Hex of the exchange-coupling films of Example 1 and Comparative Examples 1 and 2.

TABLE 1

| Example 1 | | | Comparative Example 1 | | | Comparative Example 2 | | |
|---|---|---|---|---|---|---|---|---|
| Temperature (° C.) | Hex (Oe) | Normalized Hex | Temperature (° C.) | Hex (Oe) | Normalized Hex | Temperature (° C.) | Hex (Oe) | Normalized Hex |
| 22 | 253 | 1.00 | 22 | 196 | 1.00 | 24 | 130 | 1.00 |
| — | — | — | 44 | 197 | 1.01 | 48 | 129 | 0.99 |
| 69 | 250 | 0.99 | 65 | 194 | 0.99 | 64 | 133 | 1.02 |
| — | — | — | 84 | 192 | 0.98 | 83 | 128 | 0.98 |
| 109 | 243 | 0.96 | 105 | 186 | 0.95 | 104 | 130 | 1.00 |
| 124 | 237 | 0.93 | 125 | 182 | 0.93 | 125 | 126 | 0.97 |
| 145 | 234 | 0.93 | 145 | 177 | 0.90 | 145 | 128 | 0.98 |
| 165 | 226 | 0.89 | 163 | 171 | 0.87 | 164 | 128 | 0.98 |
| 184 | 220 | 0.87 | 185 | 159 | 0.81 | 184 | 120 | 0.92 |
| 204 | 217 | 0.86 | 205 | 149 | 0.76 | 204 | 122 | 0.94 |
| 223 | 214 | 0.85 | 224 | 130 | 0.66 | 240 | 113 | 0.87 |
| — | — | — | 244 | 117 | 0.60 | — | — | — |
| 267 | 200 | 0.79 | 264 | 95 | 0.48 | 286 | 90 | 0.69 |
| 305 | 185 | 0.73 | 304 | 55 | 0.28 | — | — | — |
| 344 | 148 | 0.58 | 344 | 16 | 0.08 | 326 | 70 | 0.54 |
| 382 | 124 | 0.49 | 382 | 1 | 0.01 | 363 | 54 | 0.42 |
| — | — | — | 401 | 0 | 0.00 | 403 | 29 | 0.22 |
| 422 | 86 | 0.34 | — | — | — | 422 | 20 | 0.15 |
| 461 | 40 | 0.16 | — | — | — | 460 | 8 | 0.06 |
| 481 | 24 | 0.09 | — | — | — | — | — | — |
| 501 | 2 | 0.01 | — | — | — | 500 | 0 | 0.00 |

Figure 6:
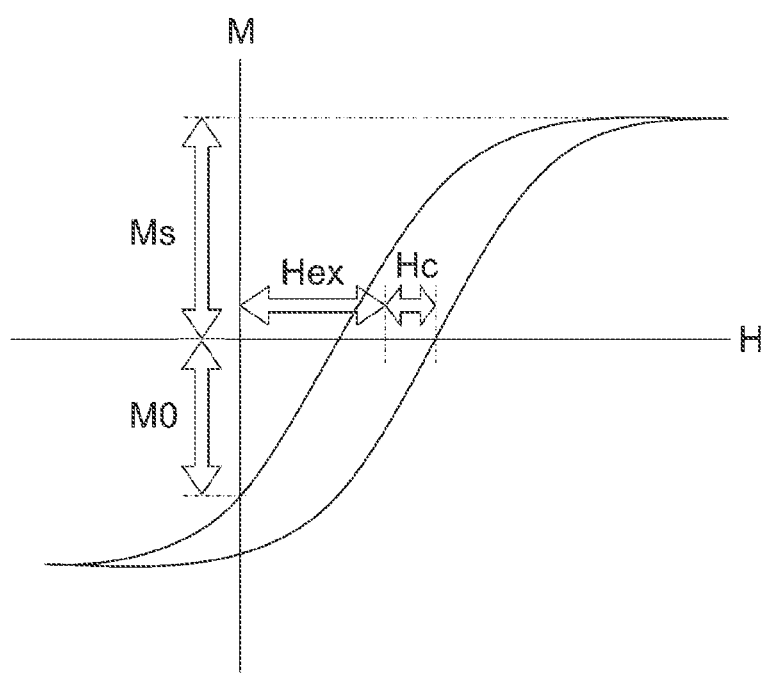
FIG. 6 is a graph illustrating a hysteresis loop of a magnetization curve of an exchange-coupling film according to the present invention.

FIG. 6 is a graph illustrating a hysteresis loop of a magnetization curve of the exchange-coupling film according to the present invention. Typically, a hysteresis loop formed by an M-H curve (magnetization curve) of a soft magnetic material is symmetrical with respect to an intersection of the H-axis and the M-axis (magnetic field H=0 Å/m, magnetization M=0 Å/m); however, as illustrated in FIG. 6, because of the effect of an exchange-coupling magnetic field Hex on a pinned magnetic layer including a ferromagnetic layer that exchange-couples with an antiferromagnetic layer, the hysteresis loop of the exchange-coupling film according to the present invention has a shape shifted along the H-axis depending on the magnitude of the exchange-coupling magnetic field Hex. As the exchange-coupling magnetic field Hex increases, the magnetization direction of the pinned magnetic layer of the exchange-coupling film is less likely to be reversed when an external magnetic field is applied thereto; thus, the pinned magnetic layer of the exchange-coupling film serves as a good pinned magnetic layer.

When the coercivity Hc, which is defined as the difference between the center of the hysteresis loop shifted along the H-axis (the magnetic field strength at the center corresponds to the exchange-coupling magnetic field Hex) and the H-axis intercept of the hysteresis loop, is smaller than Hex, even if an external magnetic field is applied to magnetize the pinned magnetic layer of the exchange-coupling film in the direction of the external magnetic field, Hex, which is stronger than the coercivity Hc, enables alignment of the magnetization direction of the pinned magnetic layer after the application of the external magnetic field is terminated. That is, when the relationship between Hex and the coercivity Hc is represented by Hex>Hc, the exchange-coupling film has good high-magnetic-field resistance.

Furthermore, when the above relationship between Hex and the coercivity Hc is evident, as illustrated in FIG. 6, the ratio of the remnant magnetization M0 to the saturation magnetization Ms (M0/Ms) is a negative value. That is, when M0/Ms is a negative value, the exchange-coupling film has better high-magnetic-field resistance, and when M0/Ms is a negative value, as the absolute value thereof becomes larger, the exchange-coupling film has more excellent high-magnetic-field resistance.

Figure 7:
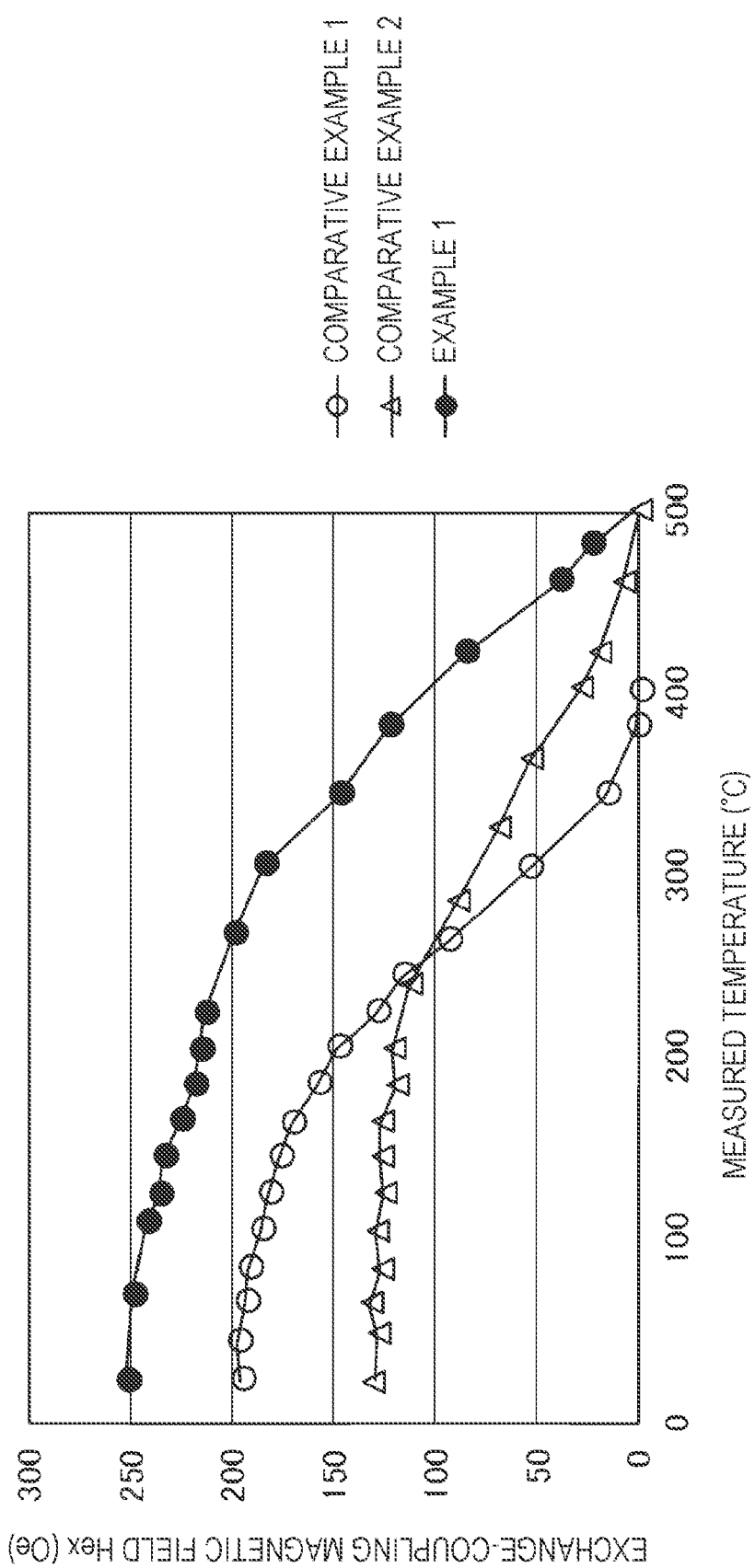
FIG. 7 is a graph illustrating the relationship between the temperature and the Hex of Example 1 and Comparative Examples 1 and 2.
Figure 8:
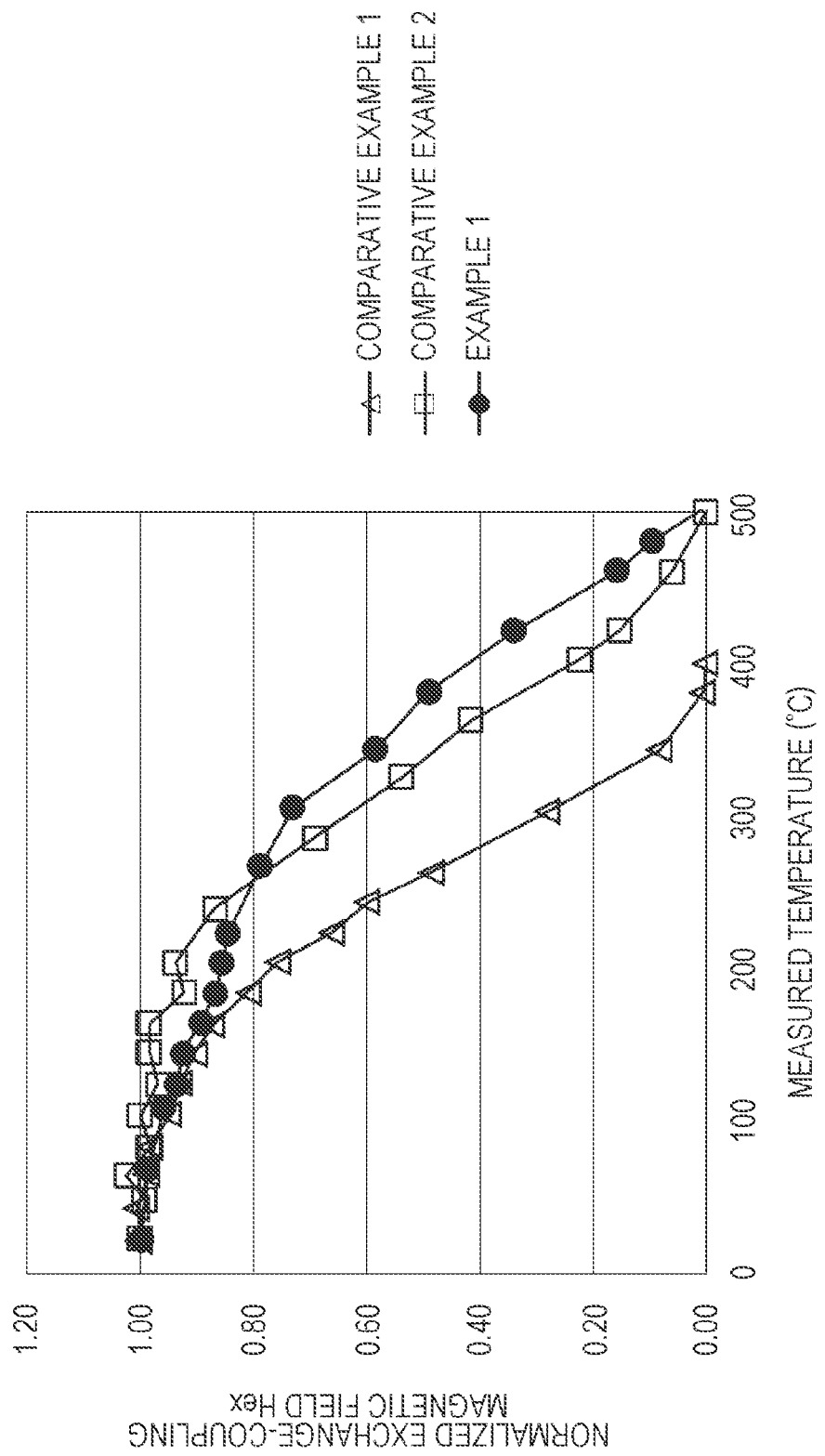
FIG. 8 is a graph illustrating the relationship between the temperature and the normalized Hex of Example 1 and Comparative Examples 1 and 2.

FIG. 7 is a graph illustrating the relationship between the temperature and the Hex of the Example and Comparative Examples as presented in Table 1. FIG. 8 is a graph illustrating the relationship between the temperature and the normalized Hex of the Example and Comparative Examples as presented in Table 1. The normalized Hex is normalized by dividing the Hex of the exchange-coupling films at each temperature by the Hex of the exchange-coupling films at room temperature.

As indicated in FIG. 7, the exchange-coupling film in Example 1 including the antiferromagnetic layer having a multilayer structure achieved a higher Hex in the range from room temperature to high-temperature conditions above 300° C., thus exhibiting better stability in a high-temperature environment, than the exchange-coupling film of Comparative Example 1 including the antiferromagnetic layer constituted by one of the two types of antiferromagnetic layers forming the multilayer structure and the exchange-coupling film of Comparative Example 2 including the antiferromagnetic layer constituted by the other type of antiferromagnetic layer.

Reference Example 1

As an antiferromagnetic layer, a $Pt_{48at\%}Mn_{52at\%}$ (520) layer was formed on a substrate, and the specific resistance (µΩ·cm) of test pieces thereof as-deposited (As depo, before heat treatment), after four hours of heat treatment at 290° C., after four hours of heat treatment at 350° C., and after four hours of heat treatment at 400° C. was measured.

Reference Example 2

As an antiferromagnetic layer, a $Pt_{51at\%}Cr_{49at\%}$ (490) layer was formed on a substrate, and the specific resistance (µΩ·cm) of test pieces prepared as in the case of Reference Example 1 was measured.

Reference Example 3

As an antiferromagnetic layer, ten stacks of $Pt_{48at\%}Mn_{52at\%}$ (10)/$Pt_{51at\%}Cr_{49at\%}$ (40) were formed on a substrate, and the specific resistance (µΩ·cm) of test pieces thereof prepared as in the case of Reference Example 1 was measured.

Table 2 presents the measurement results of Reference Examples 1 to 3.

TABLE 2

| | Treatment temperature | Reference Example 1 | Reference Example 2 | Reference Example 3 |
|---|---|---|---|---|
| Specific resistance (µΩ · cm) | As depo | 191 | 119 | 132 |
| | 290° C. | 203 | 123 | 136 |
| | 350° C. | 174 | 111 | 143 |
| | 400° C. | 146 | 98 | 140 |
| Change in specific resistance with respect to As depo (As depo is 1.00) | As depo | 1.00 | 1.00 | 1.00 |
| | 290° C. | 1.06 | 1.04 | 1.03 |
| | 350° C. | 0.91 | 0.93 | 1.08 |
| | 400° C. | 0.76 | 0.82 | 1.06 |

Figure 9:
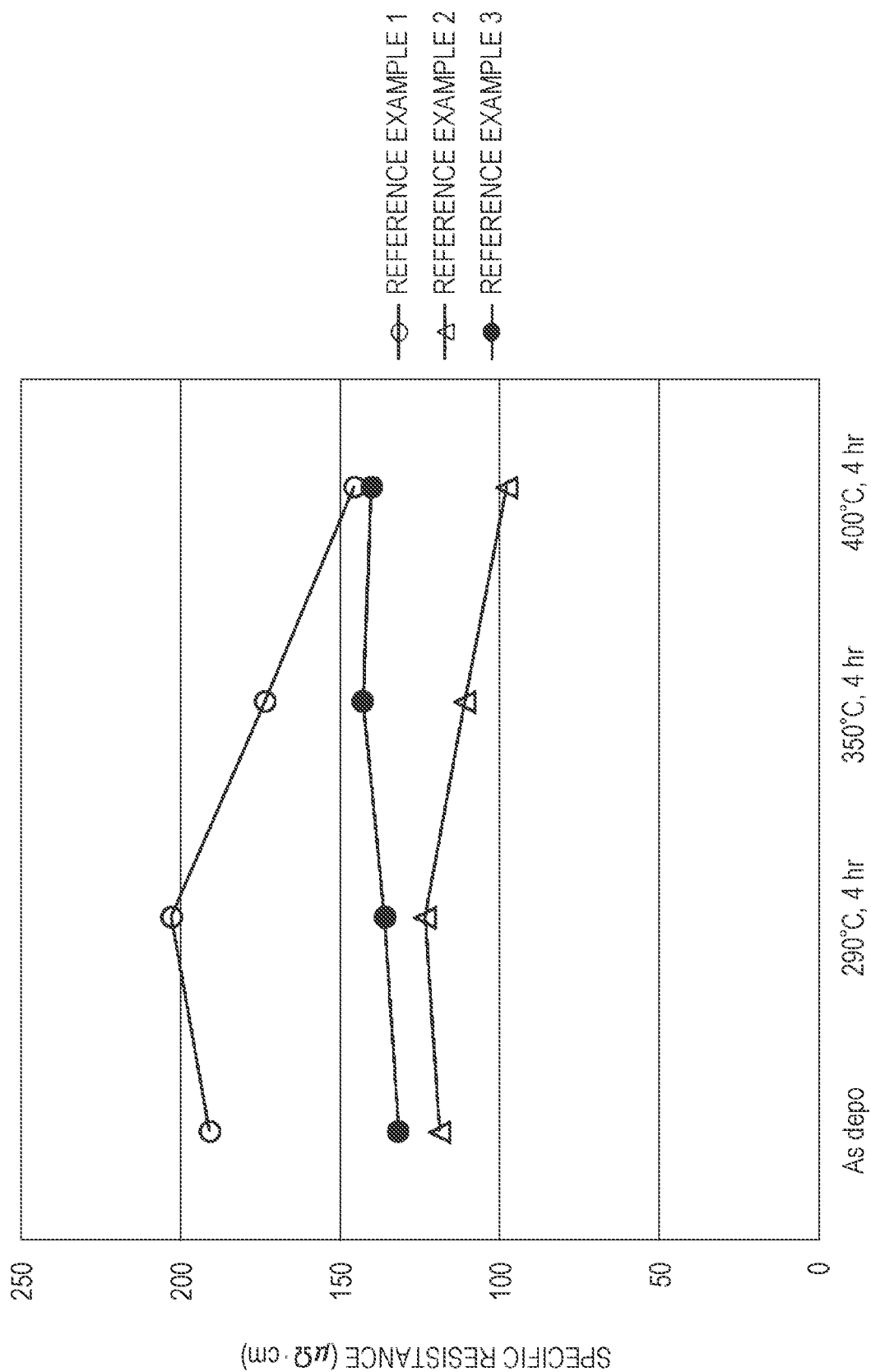
FIG. 9 is a graph illustrating the specific resistance of Reference Examples 1 to 3.
Figure 10:
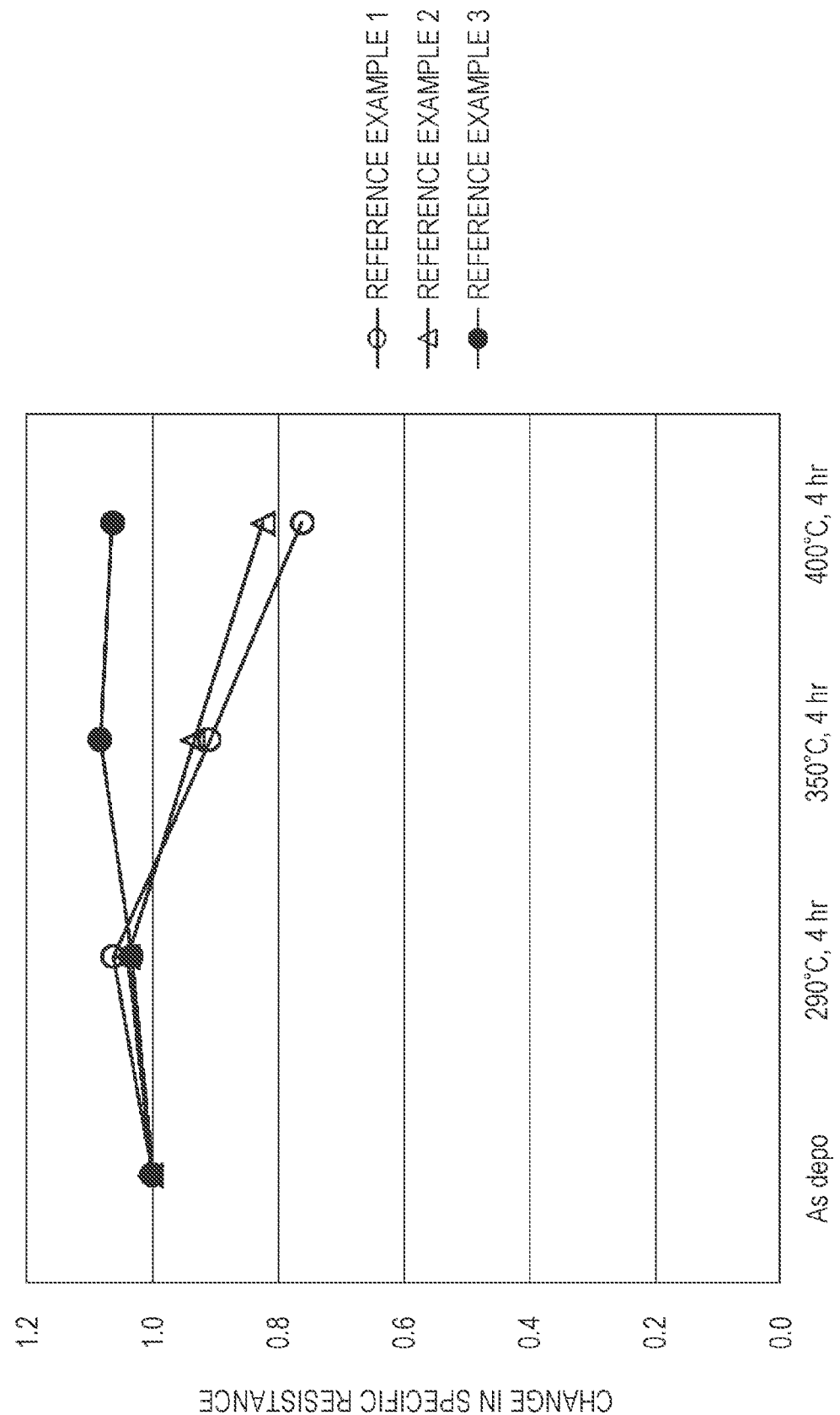
FIG. 10 is a graph illustrating the change in specific resistance with respect to As depo (as-deposited) of Reference Examples 1 to 3.

FIGS. 9 and 10 are graphs summarizing the measurement results of Reference Examples 1 to 3. As the graphs indicate, the antiferromagnetic layer of Reference Example 3 where $Pt_{48at\%}Mn_{52at\%}$ (10)/$Pt_{51at\%}Cr_{49at\%}$(40) unit layers were stacked exhibited a smaller change in specific resistance after heat treatment at high temperature than the antiferromagnetic layer of Reference Example 1 and the antiferromagnetic layer of Reference Example 2, each constituted by a layer formed of the same material as either type of unit layer.

Reference Example 4

An exchange-coupling film having the following structure was formed and annealed for 20 hours at a temperature of 350° C. and with a magnetic field strength of 1 kOe to pin the magnetization of the pinned magnetic layer 3 and the antiferromagnetic layer 2.
 Substrate
 Underlayer 1: NiFeCr (42)
 Non-magnetic material layer 4: Cu (40)/Ru (10)
 Pinned magnetic layer 3: $Co_{60at\%}Fe_{40at\%}$ (100)
 Antiferromagnetic layer 2: $Pt_{50at\%}Mn_{50at\%}$ (12)/$Pt_{51at\%}Cr_{49at\%}$ (280)
 Protection layer 6: Ta (90)

Reference Example 5

An exchange-coupling film in which the antiferromagnetic layer 2 ($Pt_{50at\%}Mn_{50at\%}$ (12)/$Pt_{51at\%}Cr_{49at\%}$ (280))) of Reference Example 4 was replaced with a $Pt_{50at\%}Mn_{50at\%}$ (18)/$Pt_{51at\%}Cr_{49at\%}$ (280) layer was formed and, as in the case of Reference Example 4, annealed for 20 hours at a temperature of 350° C. and with a magnetic field strength of 1 kOe to pin the magnetization of the pinned magnetic layer 3 and the antiferromagnetic layer 2.

Table 3 presents the normalized Hex obtained by dividing the exchange-coupling magnetic field Hex (unit: Oe) of the exchange-coupling films of Reference Examples 4 and 5 measured using a vibrating-sample magnetometer (VSM) by the Hex of the exchange-coupling films at room temperature.

TABLE 3

| Reference Example 4 | | Reference Example 5 | |
| --- | --- | --- | --- |
| Temperature (° C.) | Normalized Hex | Temperature (° C.) | Normalized Hex |
| 22 | 1.00 | 22 | 1.00 |
| 63 | 1.00 | 68 | 0.97 |
| 106 | 0.97 | 108 | 0.93 |
| 123 | 0.97 | 125 | 0.90 |
| 145 | 0.95 | 145 | 0.89 |
| 165 | 0.93 | 166 | 0.88 |
| 183 | 0.89 | 184 | 0.83 |
| 202 | 0.87 | 204 | 0.82 |
| 220 | 0.85 | 224 | 0.79 |
| 262 | 0.80 | 265 | 0.74 |
| 306 | 0.75 | 305 | 0.66 |
| 341 | 0.68 | 344 | 0.60 |
| 382 | 0.61 | 382 | 0.51 |
| 421 | 0.52 | 422 | 0.38 |
| 462 | 0.37 | 462 | 0.19 |
| — | — | 481 | 0.08 |
| 500 | 0.15 | 500 | 0.03 |

Figure 11:
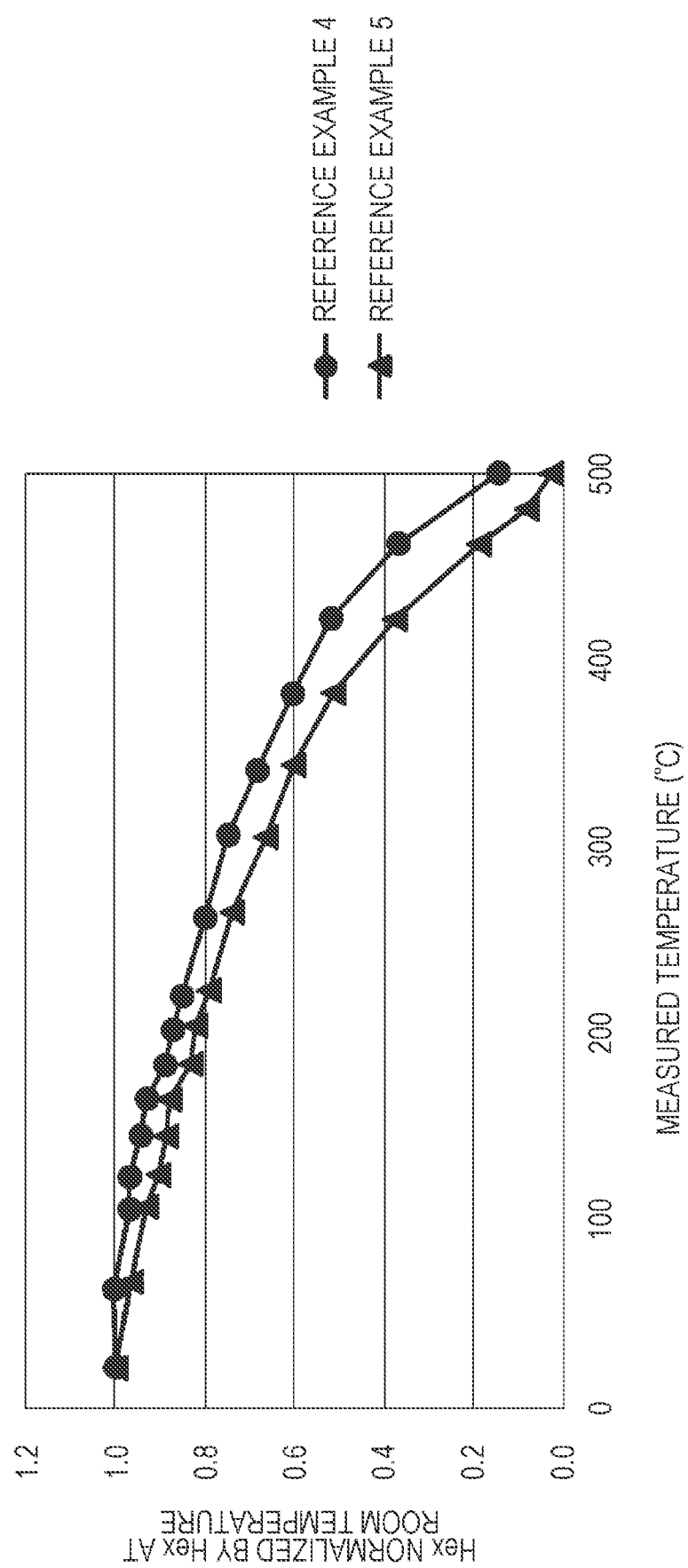
FIG. 11 is a graph illustrating the normalized Hex obtained by dividing the Hex of exchange-coupling films of Reference Examples 4 and 5 at each temperature by the Hex of the exchange-coupling films at room temperature.

FIG. 11 is a graph illustrating the normalized Hex obtained by dividing the Hex of the exchange-coupling films of Reference Examples 4 and 5 at each temperature by the Hex of the exchange-coupling films at room temperature. As the graph illustrates, the exchange-coupling films including an antiferromagnetic layer having a two-layer structure where an $X^1Cr$ layer and an $X^2Mn$ layer were stacked also exhibited only a small decrease in Hex with increasing temperature, thus exhibiting good stability in a high-temperature environment. The results also suggest that an antiferromagnetic layer having a multilayer structure where an $X^1Cr$ layer and an $X^2Mn$ layer are stacked enables a higher Hex under high-temperature conditions.

Example 2-1

A multilayer structure having the following structure was formed and annealed for 20 hours at a temperature of 350° C. and with a magnetic field strength of 15 kOe to pin the magnetization of the pinned magnetic layer 3 and the antiferromagnetic layer 2, and an exchange-coupling film was obtained.
 Substrate
 Underlayer 1: NiFeCr (40)
 Non-magnetic material layer 4: Cu (40)/Ru (10)
 Pinned magnetic layer 3: $Co_{60at\%}Fe_{40at\%}$ (20)
 Antiferromagnetic layer 2:
 Unit stacks 2U1 to 2U7: seven stacks of $Pt_{48at\%}Mn_{52at\%}$ (6)/$Pt_{51at\%}Cr_{49at\%}$ (34)
 Protection layer 6: Ta (90)/Ru (20)

Example 2-2

A multilayer structure where the structure of the antiferromagnetic layer 2 of Example 2-1 was changed to the following structure was formed.
 $X^2Mn$ layer 2B: $Pt_{48at\%}Mn_{52at\%}$ (8)
 Unit stacks 2U1 to 2U7: seven stacks of $Pt_{48at\%}Mn_{52at\%}$ (6)/$Pt_{51at\%}Cr_{49at\%}$ (34)
 The resultant multilayer structure was annealed for 20 hours at a temperature of 350° C. and with a magnetic field strength of 15 kOe to pin the magnetization of the pinned magnetic layer 3 and the antiferromagnetic layer 2, and an exchange-coupling film was obtained.

Example 2-3

A multilayer structure where the structure of the antiferromagnetic layer 2 of Example 2-1 was changed to the following structure was formed.
 $Ir_{20at\%}Mn_{80at\%}$ (8)
 Unit stacks 2U1 to 2U7: seven stacks of Pt48at % Cr52at % (6)/Pt51at % Cr49at % (34)
 The resultant multilayer structure was annealed for 20 hours at a temperature of 350° C. and with a magnetic field strength of 15 kOe to pin the magnetization of the pinned magnetic layer 3 and the antiferromagnetic layer 2, and an exchange-coupling film was obtained.

Example 2-4

A multilayer structure where the structure of the antiferromagnetic layer 2 of Example 2-1 was changed to the following structure was formed.
 $Ir_{20at\%}Mn_{80at\%}$ (8)
 $X^2Mn$ layer 2B: $Pt_{48at\%}Cr_{52at\%}$ (8)
 Unit stacks 2U1 to 2U7: seven stacks of $Pt_{48at\%}Mn_{52at\%}$ (6)/$Pt_{51at\%}Cr_{49at\%}$ (34)
 The resultant multilayer structure was annealed for 20 hours at a temperature of 350° C. and with a magnetic field strength of 15 kOe to pin the magnetization of the pinned magnetic layer 3 and the antiferromagnetic layer 2, and an exchange-coupling film was obtained.

Example 2-5

A multilayer structure where the structure of the antiferromagnetic layer 2 of Example 2-1 was changed to the following structure was formed.

$X^2Cr$ layer 2B: $Pt_{51at\%}Cr_{49at\%}$ (6)

Unit stacks 2U1 to 2U7: seven stacks of $Pt_{48at\%}Mn_{52at\%}$ (6)/$Pt_{51at\%}Cr_{49at\%}$ (34)

The resultant multilayer structure was annealed for 20 hours at a temperature of 350° C. and with a magnetic field strength of 15 kOe to pin the magnetization of the pinned magnetic layer 3 and the antiferromagnetic layer 2, and an exchange-coupling film was obtained.

Example 2-6

A multilayer structure where the structure of the antiferromagnetic layer 2 of Example 2-1 was changed to the following structure was formed.

$X^2Mn$ layer 2B: $Pt_{48at\%}Mn_{52at\%}$ (8)
$X^2Cr$ layer 2B: $Pt_{51at\%}Cr_{49at\%}$ (6)

Unit stacks 2U1 to 2U7: seven stacks of $Pt_{48at\%}Mn_{52at\%}$ (6)/$Pt_{51at\%}Cr_{49at\%}$ (34)

The resultant multilayer structure was annealed for 20 hours at a temperature of 350° C. and with a magnetic field strength of 15 kOe to pin the magnetization of the pinned magnetic layer 3 and the antiferromagnetic layer 2, and an exchange-coupling film was obtained.

Example 2-7

A multilayer structure where the structure of the antiferromagnetic layer 2 of Example 2-1 was changed to the following structure was formed.

$Ir_{20at\%}Mn_{80at\%}$ (8)
$X^2Cr$ layer 2B: $Pt_{51at\%}Cr_{49at\%}$ (6)

Unit stacks 2U1 to 2U7: seven stacks of $Pt_{48at\%}Mn_{52at\%}$ (6)/$Pt_{51at\%}Cr_{49at\%}$ (34)

The resultant multilayer structure was annealed for 20 hours at a temperature of 350° C. and with a magnetic field strength of 15 kOe to pin the magnetization of the pinned magnetic layer 3 and the antiferromagnetic layer 2, and an exchange-coupling film was obtained.

Example 2-8

A multilayer structure where the structure of the antiferromagnetic layer 2 of Example 2-1 was changed to the following structure was formed.

$Ir_{20at\%}Mn_{80at\%}$ (8)
$X^1Cr$ layer 2A: $Pt_{48at\%}Cr_{52at\%}$ (8)
$X^2Cr$ layer 2B: $Pt_{51at\%}Cr_{49at\%}$ (6)

Unit stacks 2U1 to 2U7: seven stacks of $Pt_{48at\%}Mn_{52at\%}$ (6)/$Pt_{51at\%}Cr_{49at\%}$ (34)

The resultant multilayer structure was annealed for 20 hours at a temperature of 350° C. and with a magnetic field strength of 15 kOe to pin the magnetization of the pinned magnetic layer 3 and the antiferromagnetic layer 2, and an exchange-coupling film was obtained.

Comparative Example 2-1

The same procedure as in Example 2-1 was performed to pin the magnetization of the pinned magnetic layer and the antiferromagnetic layer except that the antiferromagnetic layer 2 of Example 2-1 was replaced with an $Ir_{22at\%}Mn_{78at\%}$ (80) layer.

Comparative Example 2-2

The same procedure as in Example 2-1 was performed to pin the magnetization of the pinned magnetic layer and the antiferromagnetic layer except that the antiferromagnetic layer 2 of Example 2-1 was replaced with a $Pt_{50at\%}Mn_{50at\%}$ (300) layer, and an exchange-coupling film was obtained.

Comparative Example 2-3

The same procedure as in Example 2-1 was performed to pin the magnetization of the pinned magnetic layer and the antiferromagnetic layer except that the antiferromagnetic layer 2 of Example 2-1 was replaced with a $Pt_{51at\%}Cr_{49at\%}$ (300) layer, and an exchange-coupling film was obtained.

Figure 12:
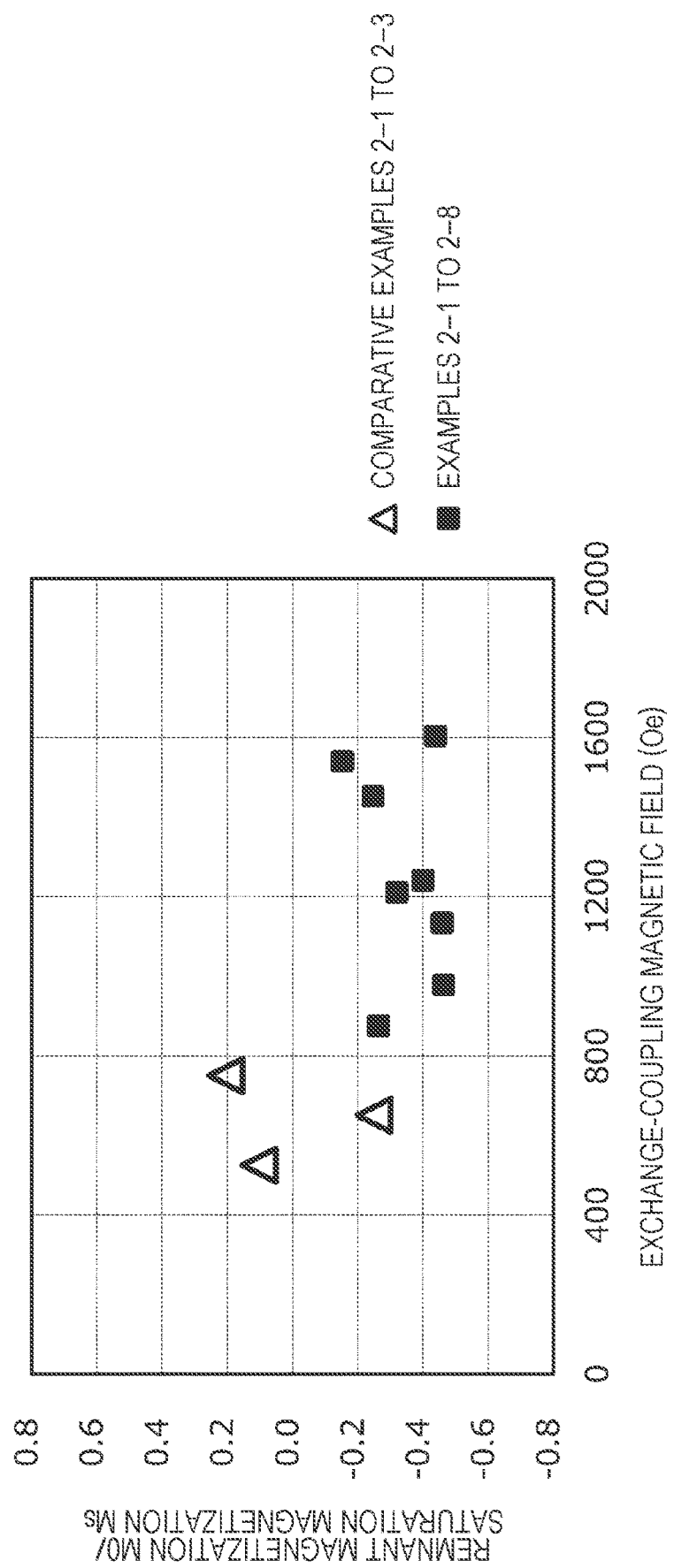
FIG. 12 is a graph illustrating the relationship between remnant magnetization M0/saturation magnetization Ms and exchange-coupling magnetic field Hex for exchange-coupling films of Examples 2-1 to 2-8 and Comparative Examples 2-1 to 2-3.
Figure 13:
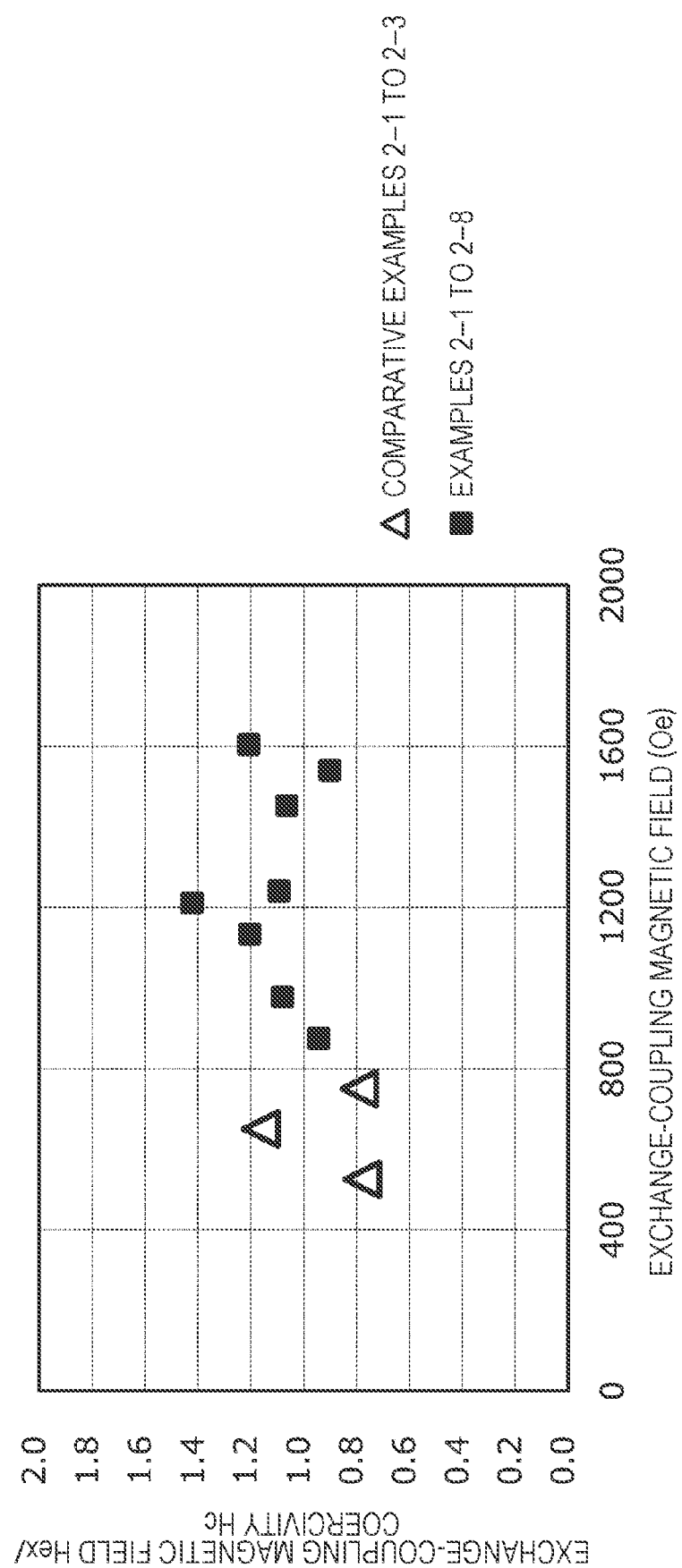
FIG. 13 is a graph illustrating the relationship between exchange-coupling magnetic field Hex/coercivity Hc and exchange-coupling magnetic field Hex for the exchange-coupling films of Examples 2-1 to 2-8 and Comparative Examples 2-1 to 2-3.

The magnetization curves of the exchange-coupling films of Examples 2-1 to 2-8 and Comparative Examples 2-1 to 2-3 were measured using a vibrating-sample magnetometer (VSM). From the resultant hysteresis loops, the exchange-coupling magnetic field Hex (unit: Oe), the coercivity Hc (unit: Oe), the ratio of the remnant magnetization M0 to the saturation magnetization Ms (M0/Ms), and the ratio of the exchange-coupling magnetic field Hex to the coercivity Hc (Hex/Hc) were determined. Table 4 presents the results. Furthermore, on the basis of the results presented in Table 4, FIG. 12 illustrates the relationship between remnant magnetization M0/saturation magnetization Ms and exchange-coupling magnetic field Hex, and FIG. 13 illustrates the relationship between exchange-coupling magnetic field Hex/coercivity Hc and exchange-coupling magnetic field Hex.

TABLE 4

| | IrMn thickness (Å) | PtMn thickness (Å) | PtCr thickness (Å) | IrMn thickness + PtMn thickness + PtCr thickness (Å) | Base antiferromagnetc layer (Å) | Exchange-coupling magnetic field Hex (Oe) | Coercivity Hc (Oe) | Remnant magnetization M0/ saturation magnetization Ms | Hex/Hc |
|---|---|---|---|---|---|---|---|---|---|
| Example 2-1 | 0 | 0 | 0 | 0 | Seven stacks of PtMn (6)/ 50PtCr (34) | 1211 | 788 | −0.32 | 1.42 |
| Example 2-2 | 0 | 8 | 0 | 8 | | 1452 | 1263 | −0.25 | 1.06 |
| Example 2-3 | 8 | 0 | 0 | 8 | | 875 | 858 | −0.26 | 0.94 |
| Example 2-4 | 8 | 8 | 0 | 16 | | 1134 | 872 | −0.46 | 1.20 |
| Example 2-5 | 0 | 0 | 6 | 6 | | 1604 | 1229 | −0.44 | 1.21 |
| Example 2-6 | 0 | 8 | 6 | 14 | | 1540 | 1580 | −0.15 | 0.90 |
| Example 2-7 | 8 | 0 | 6 | 14 | | 978 | 837 | −0.46 | 1.08 |
| Example 2-8 | 8 | 8 | 6 | 22 | | 1241 | 1050 | −0.40 | 1.09 |

TABLE 4-continued

| | IrMn thickness (Å) | PtMn thickness (Å) | PtCr thickness (Å) | IrMn thickness + PtMn thickness + PtCr thickness (Å) | Base antiferromagnetic layer (Å) | Exchange-coupling magnetic field Hex (Oe) | Coercivity Hc (Oe) | Remnant magnetization M0/saturation magnetization Ms | Hex/Hc |
|---|---|---|---|---|---|---|---|---|---|
| Comparative Example 2-1 | 0 | 0 | 0 | 0 | 22IrMn (80) | 650 | 560 | −0.25 | 1.16 |
| Comparative Example 2-2 | 0 | 0 | 0 | 0 | 50PtMn (300) | 750 | 950 | 0.20 | 0.79 |
| Comparative Example 2-3 | 0 | 0 | 0 | 0 | 51PtCr (300) | 525 | 675 | 0.10 | 0.78 |

A surface analysis (measurement area: 71 μm×71 μm) of the exchange-coupling film of Example 2-5 was performed using an Auger electron spectroscopy instrument while argon-sputtering the film from a side closer to the protection layer 6 to obtain the content distribution of Pt, Cr, and Mn in the depth direction (depth profile). The argon sputter rate, which was determined in terms of $SiO_2$, was 1.0 nm/min.

Figure 14:
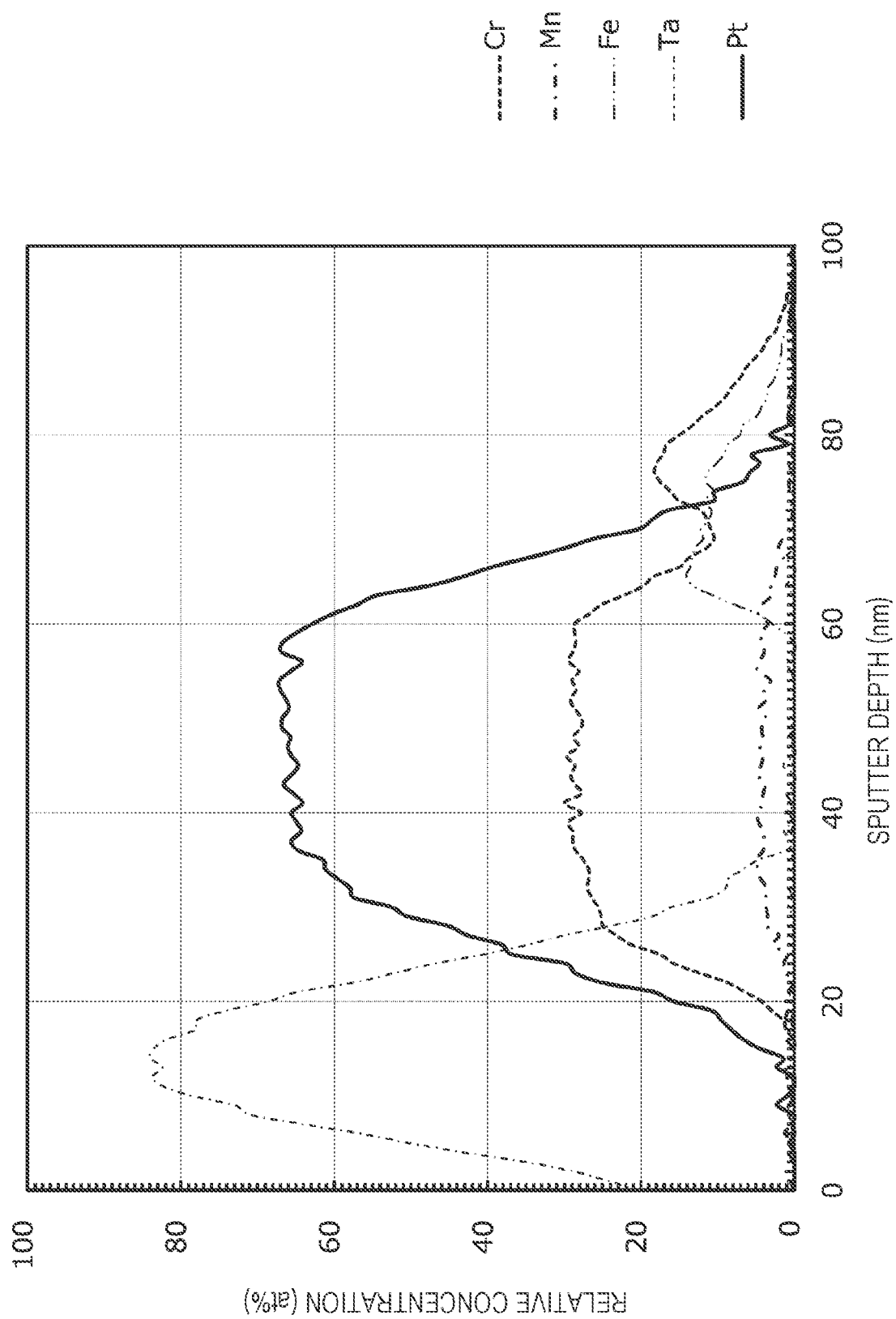
FIG. 14 is a depth profile of the exchange-coupling film of Example 2-5.

FIG. 14 is a depth profile of the exchange-coupling film of Example 2-5. To confirm the depth position of the pinned magnetic layer 3 and the non-magnetic material layer 4, Fe (one of the constituent elements of the pinned magnetic layer 3) and Ta (an element constituting a side of the protection layer 6, the side being closer to the antiferromagnetic layer 2) were also included in the depth profile. As presented in FIG. 14, in the range of a depth of about 35 nm to a depth of about 55 nm of the depth profile of the exchange-coupling film of Example 2-5, a depth range that is only reflective of the composition of the antiferromagnetic layer 2 and that remains virtually immune to the impact of the pinned magnetic layer 3 and to the impact of the protection layer 6 was confirmed. The average contents of Pt, Cr, and Mn in this depth range were measured. The results are as follows.

Pt: 65.5 at %
Cr: 28.5 at %
Mn: 4.2 at %

These results confirmed that the Pt content in the antiferromagnetic layer 2 was 30 at % or more. Thus, the antiferromagnetic layer 2 probably had a face-centered cubic (fcc) structure.

Furthermore, the ratio of the Mn content to the Cr content (Mn/Cr ratio) based on the above results was calculated to be 0.15. The above depth range corresponds to the seven unit stacks formed of $Pt_{48at\%}Mn_{52at\%}$ (6)/$Pt_{51at\%}Cr_{49at\%}$ (34) units. The contents of Pt, Cr, and Mn of the $Pt_{48at\%}Mn_{52at\%}$ (6)/$Pt_{51at\%}Cr_{49at\%}$ (34) units were calculated to be as follows.

Pt: 50.6 at %
Cr: 41.7 at %
Mn: 7.8 at %

The Mn/Cr ratio based on these contents was 0.19. Given the difference in mobility between the elements (Pt, Cr, and Mt) during annealing and the measurement precision of the depth profile, the measured Mn/Cr ratio is roughly close to the designed value when the multilayer structure is formed.

For confirmation, a depth profile of the multilayer structure (unannealed) that provided Example 2-5 was similarly determined. FIG. 15 presents the results. As presented in FIG. 15, the results of the depth profile obtained by a surface analysis of the multilayer structure using an Auger electron spectroscopy instrument while argon-sputtering the film did not indicate changes in the contents of Mn and Cr corresponding to the repetition of the units in the seven unit stacks. That is, it was confirmed that the resolution of the depth profile did not reach 4 nm.

Thus, a region of 100 μm×100 μm was irradiated by time-of-flight secondary ion mass spectrometry (TOF-SIMS) using a $Bi^+$ ion as a primary ion to detect a secondary ion, and an $O_2^+$ ion was used as a milling ion to obtain a depth profile. The average milling rate was about 1.5 Å/s.

Seven Mn-containing ions such as $Mn^+$ and $MnO^+$ and eight Cr– containing ions such as $Cr^+$ and $CrO^+$ were detected. Among these ions, $Cr^+$ was unable to be quantitatively evaluated due to the excessively high detection sensitivity thereof. $Pt^+$ was also unable to be quantitatively evaluated due to the excessively low detection sensitivity thereof. Thus, a depth profile of the total detected intensity of seven Mn-containing ions and a depth profile of the total detected intensity of seven Cr-containing ions were determined. On the basis of the results, a depth profile of the detected intensity ratio at each depth ("total detected intensity of seven Mn-containing ions"/"total detected intensity of seven Cr-containing ions"), which is referred to as "I—Mn/Cr", was determined.

Figure 16A:
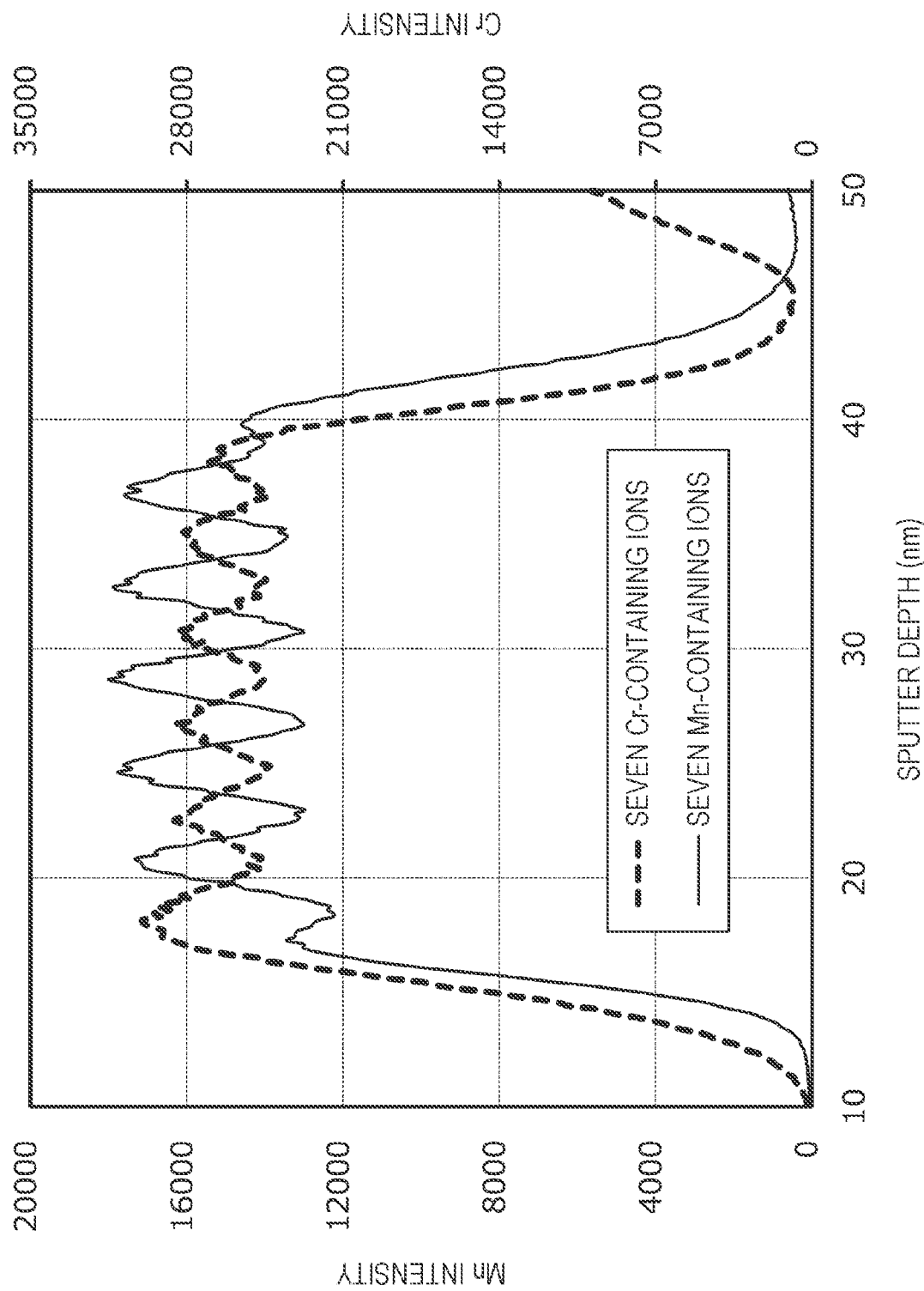
FIG. 16A is a depth profile of the total detected intensity of seven Mn-containing ions and the total detected intensity of seven Cr-containing ions for a multilayer structure of Example 2-1.
Figure 17B:
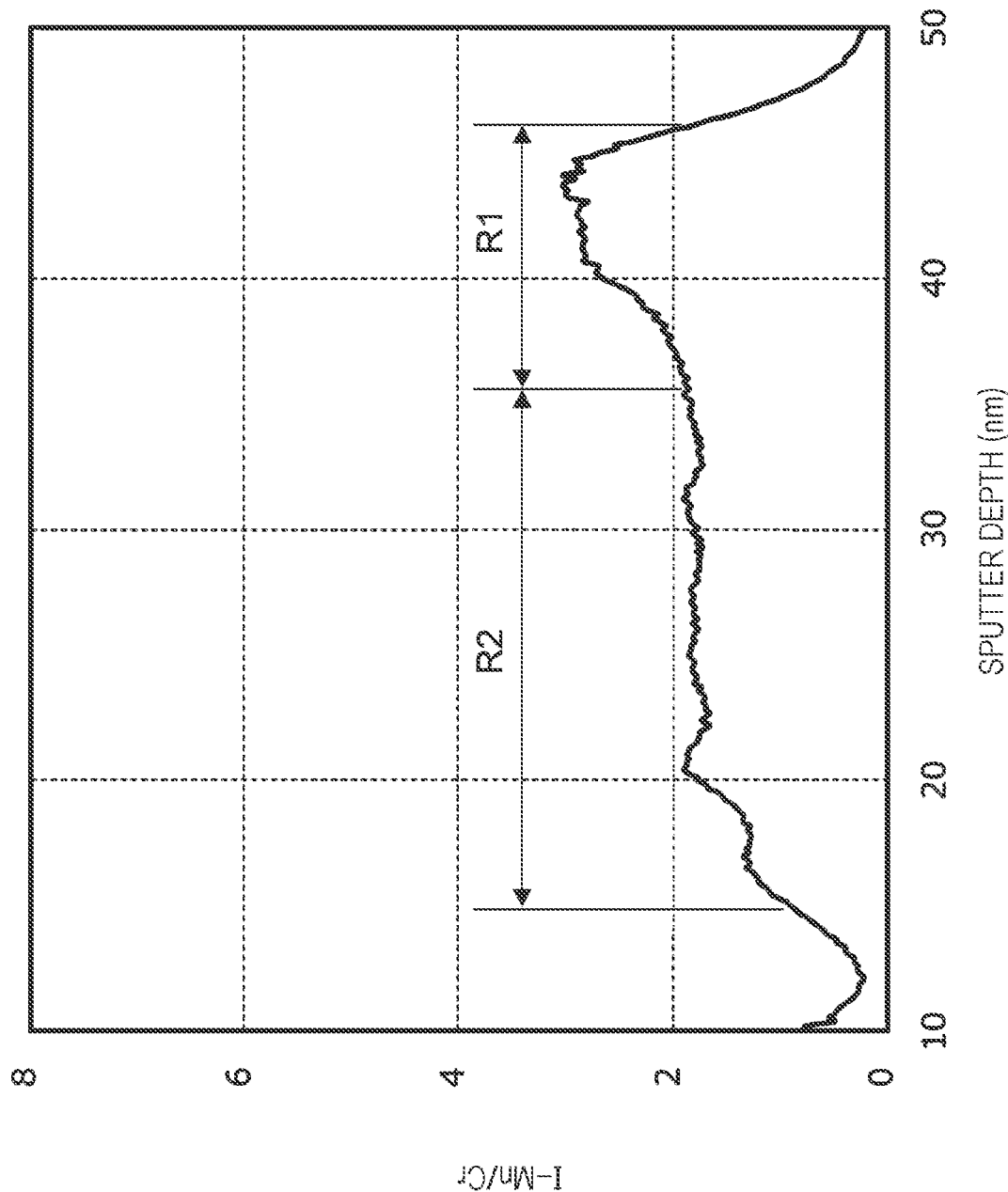
FIG. 17B is a depth profile of I—Mn/Cr for the exchange-coupling film of Example 2-1.
Figure 18A:
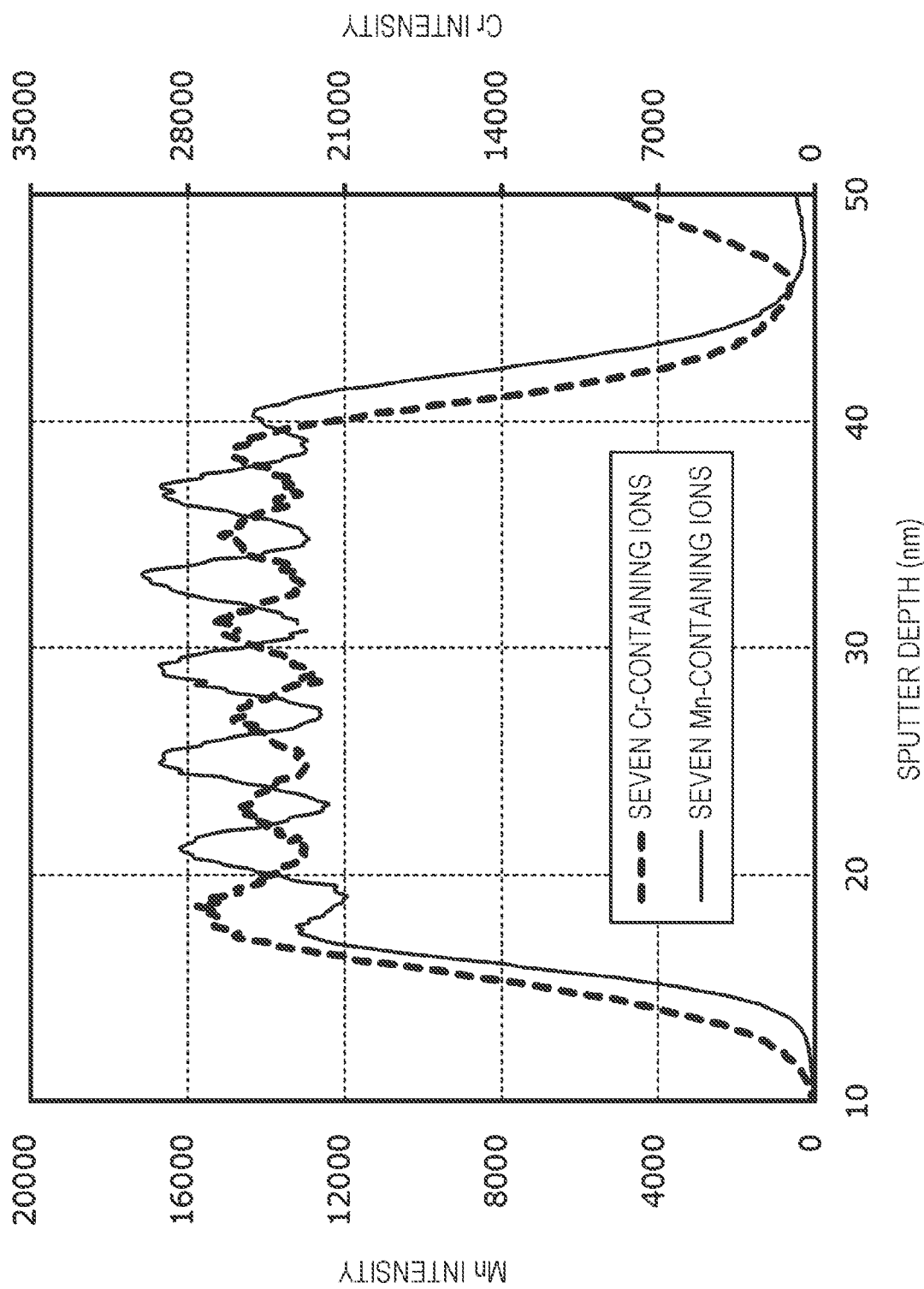
FIG. 18A is a depth profile of the total detected intensity of seven Mn-containing ions and the total detected intensity of seven Cr-containing ions for the multilayer structure (unannealed) of Example 2-5.
Figure 18B:
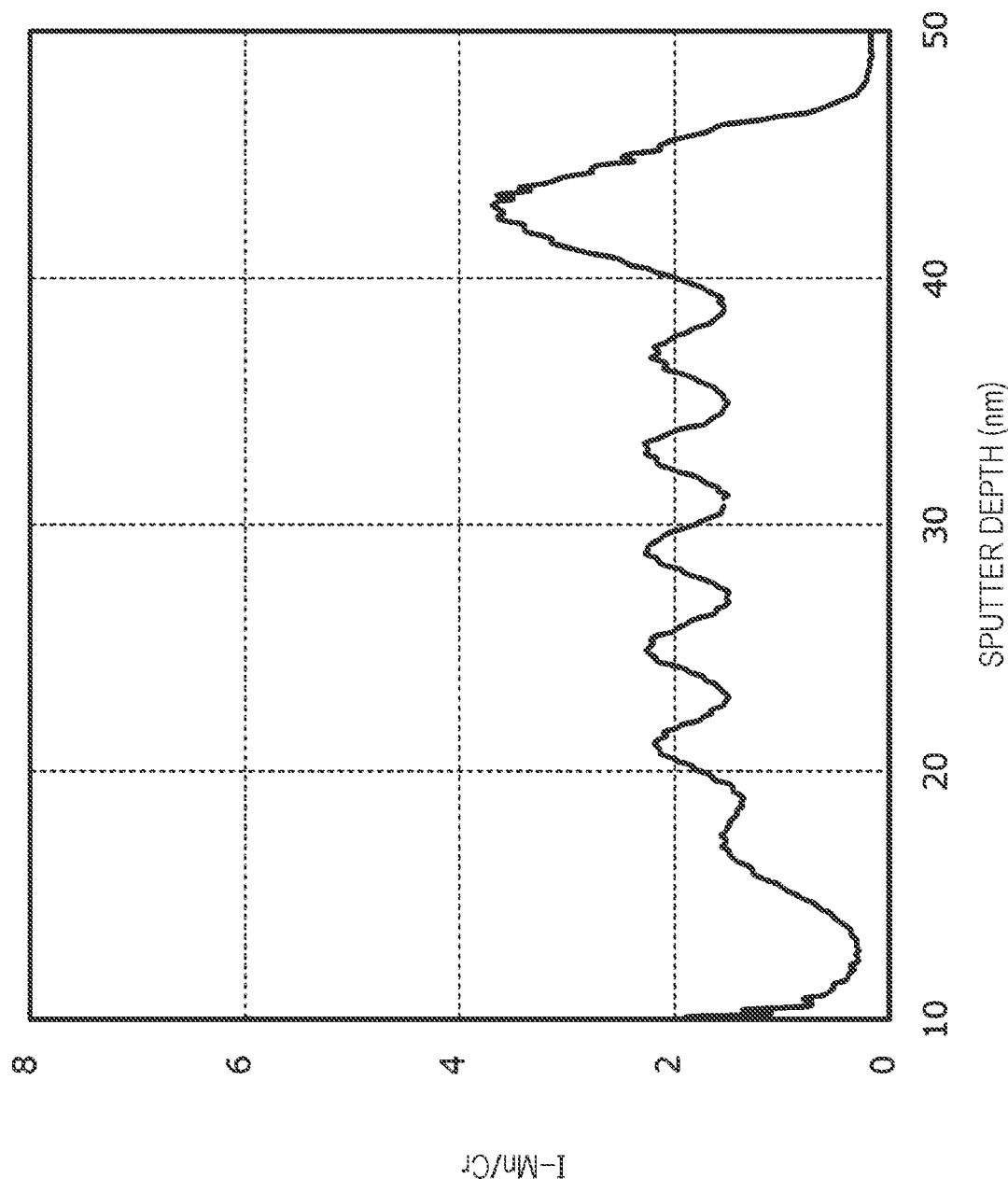
FIG. 18B is a depth profile of I—Mn/Cr for the multilayer structure (unannealed) of Example 2-5.
Figure 19B:
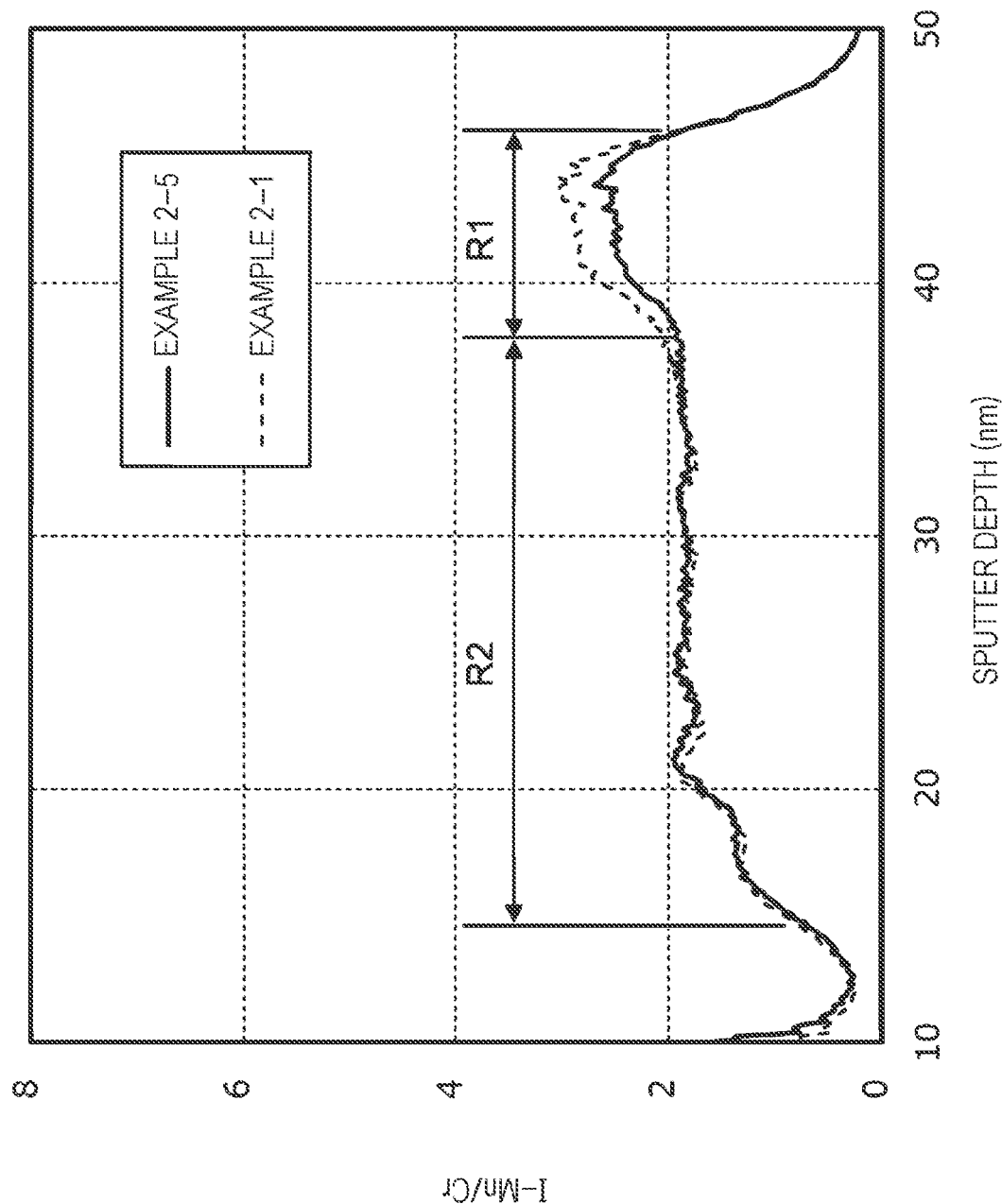
FIG. 19B is a depth profile of I—Mn/Cr for the exchange-coupling film of Example 2-5.

These depth profiles were determined for the multilayer structure (unannealed) and the exchange-coupling film of Example 2-1 and for the multilayer structure (unannealed) and the exchange-coupling film of Example 2-5. FIG. 16A is a depth profile of the total detected intensity of seven Mn-containing ions and the total detected intensity of seven Cr-containing ions for the multilayer structure (unannealed) of Example 2-1. FIG. 16B is a depth profile of I—Mn/Cr for the multilayer structure (unannealed) of Example 2-1. FIG. 17A is a depth profile of the total detected intensity of seven Mn-containing ions and the total detected intensity of seven Cr-containing ions for the exchange-coupling film of Example 2-1. FIG. 17B is a depth profile of I—Mn/Cr for the exchange-coupling film of Example 2-1. FIG. 18A is a depth profile of the total detected intensity of seven Mn-containing ions and the total detected intensity of seven Cr-containing ions for the multilayer structure (unannealed) of Example 2-5. FIG. 18B is a depth profile of I—Mn/Cr for the multilayer structure (unannealed) of Example 2-5. FIG. 19A is a depth profile of the total detected intensity of seven Mn-containing ions and the total detected intensity of seven Cr-containing ions for the exchange-coupling film of Example 2-5. FIG. 19B is a depth profile of I—Mn/Cr for the exchange-coupling film of Example 2-5.

As presented in FIG. 16A, fluctuations in Mn intensity and fluctuations in Cr intensity due to the structure of the unit stacks (alternating multilayer structure) were confirmed in the depth profile by TOF-SIMS. In the depth profile of I—Mn/Cr based on these results presented in FIG. 16B, fluctuations in I—Mn/Cr corresponding to the stacked layers of each of the units in the unit stacks and the presence of a region on a side closer to the pinned magnetic layer 3, the region having a higher Mn content than the other regions, were confirmed.

This tendency was also observed in the exchange-coupling films ordered by annealing. As presented in FIG. 17A, annealing induced the interdiffusion of Mn and Cr in the interior of each of the units in the unit stacks and between the plurality of stacked units. As a result, the fluctuations in the detected intensity of Mn-containing ions and the fluctuations in the detected intensity of Cr-containing ions due to the structure of the unit stacks (alternating multilayer structure) confirmed in FIG. 16A were not confirmed. Thus, orderly fluctuations were not confirmed in the depth profile of I—Mn/Cr.

On the other hand, the presence of a region on a side closer to the pinned magnetic layer 3, the region having a higher Mn content than the other regions, was clearly confirmed. Thus, it was confirmed that the antiferromagnetic layer 2 included in the exchange-coupling film of Example 2-1 and formed of an X—(Cr—Mn) layer (a Pt—(Cr—Mn) layer) had a first region R1 closer to the pinned magnetic layer 3 and a second region R2 farther away from the pinned magnetic layer 3. It was also confirmed that the Mn content in the first region R1 was higher than the Mn content in the second region R2.

As presented in FIGS. 18 and 19, the tendency observed in the multilayer structure and in the exchange-coupling film of Example 2-1 was also confirmed in the multilayer structure and in the exchange-coupling film of Example 2-5. That is, fluctuations in Mn intensity and fluctuations in Cr intensity due to the structure of the unit stacks (alternating multilayer structure) were confirmed (FIG. 18A) in the multilayer structure of Example 2-5. Fluctuations in I—Mn/Cr due to the structure of the unit stacks (alternating multilayer structure) were also confirmed (FIG. 18B) in the multilayer structure of Example 2-5. In the exchange-coupling film of Example 2-5 ordered by annealing, the occurrence of interdiffusion of Mn and Cr in the interior of each of the units in the unit stacks and between the plurality of stacked units was confirmed (FIG. 19A). Furthermore, it was confirmed that the antiferromagnetic layer 2 included a first region R1 closer to the pinned magnetic layer 3 that had a higher Mn content and a second region R2 farther away from the pinned magnetic layer 3 that had a lower Mn content (FIG. 19B).

As evident from the comparison with the result regarding the exchange-coupling film of Example 2-1 indicated by a thin dashed line in FIG. 19B, I—Mn/Cr in the first region R1 of the exchange-coupling film of Example 2-5 was lower than I—Mn/Cr in the first region R1 of the exchange-coupling film of Example 2-1. This is probably reflective of the fact that, in contrast to the multilayer structure of Example 2-1, the exchange-coupling film of Example 2-5 was formed from a multilayer structure where a 51 PtCr (6) layer was further disposed at a position closest to the pinned magnetic layer 3.

In the present example, the exchange-coupling film including the antiferromagnetic layer 2 having a higher Mn content in the first region R1 was formed from a multilayer structure including a plurality of unit stacks, each formed of a unit of $X^1Cr$ (PtCr) and $X^2Mn$ (MnCr) layers, but is not limited thereto. The exchange-coupling film may be formed from a multilayer structure obtained by depositing a Mn layer or Mn-rich alloy layer (e.g., an $Ir_{22at\%}Mn_{78at\%}$ layer) on a side closer to the pinned magnetic layer 3 and depositing an XCrMn layer thereon.

Example 3-1

A multilayer structure having the following structure was formed and annealed for 20 hours at a temperature of 350° C. and with a magnetic field strength of 15 kOe to pin the magnetization of the pinned magnetic layer 3 and the antiferromagnetic layer 2, and an exchange-coupling film was obtained.
Substrate
Underlayer 1: Ta (30)/NiFeCr (42)
Non-magnetic material layer 4: Cu (40)/Ru (10)
Pinned magnetic layer 3: $Co_{60at\%}Fe_{40at\%}$ (20)
Antiferromagnetic layer 2:
$X^2Cr$ layer 2B: $Pt_{51at\%}Cr_{49at\%}$ (6)
Unit stacks 2U1 to 2U7: seven stacks of $Pt_{48at\%}Mn_{52at\%}$ (6)/$Pt_{51at\%}Cr_{49at\%}$ (34)
Protection layer 6: Ta (100)

Comparative Example 3-1

A multilayer structure having the following structure was formed and annealed for 20 hours at a temperature of 350° C. and with a magnetic field strength of 15 kOe to pin the magnetization of the pinned magnetic layer 3 and the antiferromagnetic layer 2, and an exchange-coupling film was obtained.
Substrate
Underlayer 1: Ta (30)/NiFeCr (42)
Non-magnetic material layer 4: Cu (40)/Ru (30)
Pinned magnetic layer 3: $Co_{90at\%}Fe_{10at\%}$ (40)
Antiferromagnetic layer 2: $Pt_{50at\%}Mn_{50at\%}$ (300)
Protection layer 6: Ta (50)

Comparative Example 3-2

A multilayer structure in which the antiferromagnetic layer 2 of Comparative Example 3-1 was replaced with a $Pt_{50at\%}Cr_{50at\%}$ (300) layer was formed and, as in the case of Comparative Example 3-1, annealed for 20 hours at a temperature of 350° C. and with a magnetic field strength of 15 kOe to pin the magnetization of the pinned magnetic layer and the antiferromagnetic layer, and an exchange-coupling film was obtained.

Each of the multilayer structures (unannealed) and the exchange-coupling films formed in Example 3-1 and Comparative Examples 3-1 and 3-2 described above was subjected to X-ray diffraction analysis by a θ-2θ method using a Co-Kα radiation in a 2θ range of 20 to 120 degrees.

Figure 20:
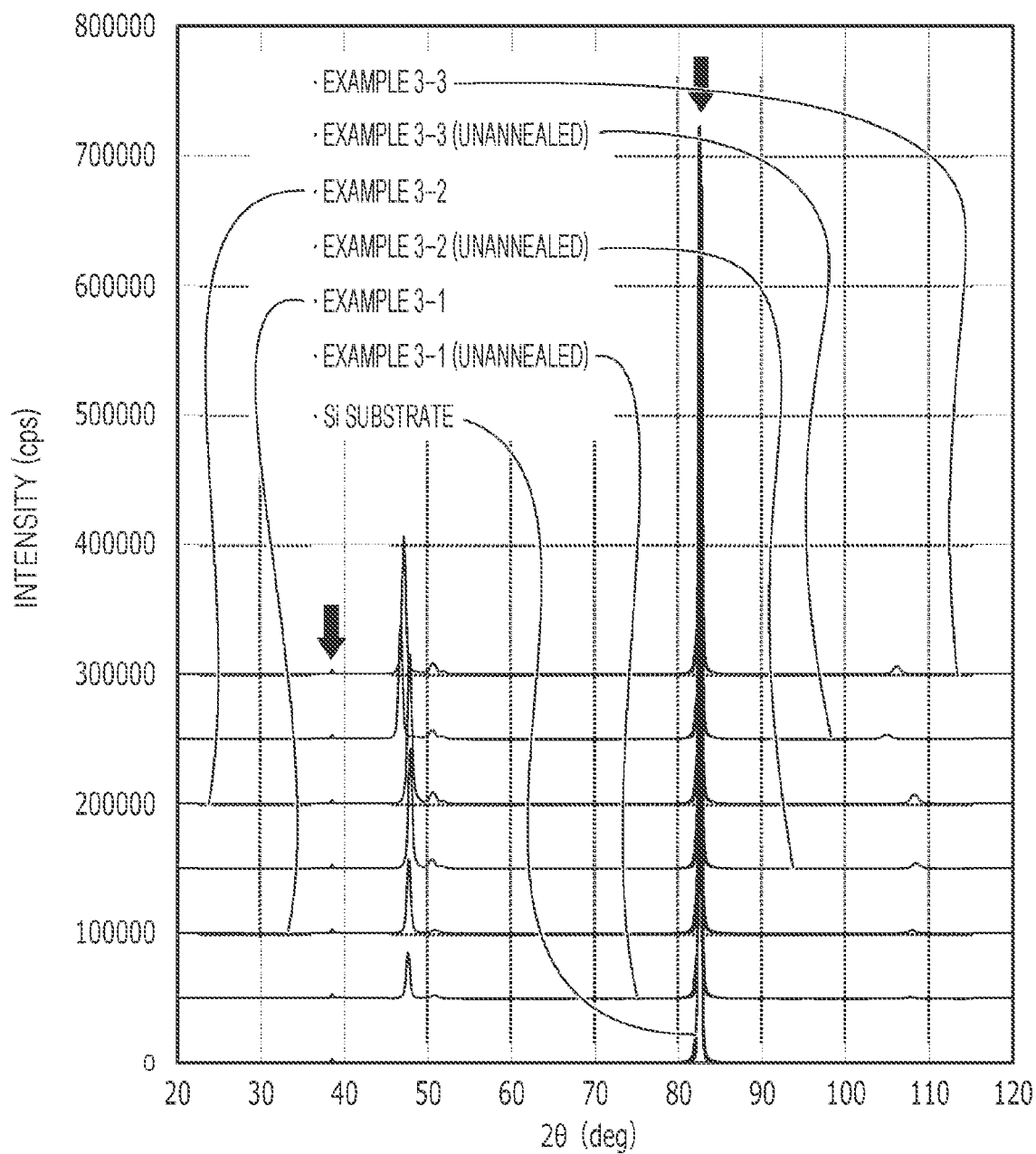
FIG. 20 is an X-ray diffraction spectrum for Example 3-1 and Comparative Examples 3-1 and 3-2.

FIG. 20 presents the results. In any of the measurements, X-ray reflection peaks other than the two X-ray reflection peaks attributed to the Si substrate (the peak with 2θ positioned at about 38 degrees and the peak with 2θ positioned at about 83 degrees indicated by bold arrows in FIG. 20) were confirmed in a 2θ range of 45 to 55 degrees and in a 2θ range of 105 to 115 degrees. Among them, the peak in a 2θ range of 45 to 50 degrees was an X-ray reflection peak attributed to the (111) plane of the antiferromagnetic layer 2, and the peak in a 2θ range of 102 to 112 degrees was an X-ray reflection peak attributed to the (222) plane of the antiferromagnetic layer 2. In FIG. 20, the peaks confirmed in a 2θ range of 49 to 53 degrees are X-ray reflection peaks attributed to layers other than the antiferromagnetic layer 2, specifically, the NiFeCr layer, the Cu layer, the Ru layer, and the CoFe layer.

FIG. 21A is an enlarged X-ray diffraction spectrum of FIG. 20 in a 2θ range of 45 to 50 degrees. FIG. 21B is an enlarged X-ray diffraction spectrum of FIG. 20 in a 2θ range of 102 to 112 degrees. The maximum values of the X-ray reflection peaks presented in these figures are summarized in Tables 5 ((111) plane) and 6 ((222) plane)).

TABLE 5

| (111) | | 2θ (degree) | Interplanar spacing (Å) |
|---|---|---|---|
| Example 3-1 | Unannealed | 47.60 | 2.217 |
| | Exchange-coupling film | 47.72 | 2.213 |
| Comparative Example 3-1 | Unannealed | 46.72 | 2.256 |
| | Exchange-coupling film | 47.12 | 2.238 |
| Comparative Example 3-2 | Unannealed | 47.86 | 2.205 |
| | Exchange-coupling film | 47.80 | 2.208 |

TABLE 6

| (222) | | 2θ (degree) | Interplanar spacing (Å) |
|---|---|---|---|
| Example 3-1 | Unannealed | 107.72 | 1.108 |
| | Exchange-coupling film | 107.84 | 1.107 |
| Comparative Example 3-1 | Unannealed | 104.87 | 1.129 |
| | Exchange-coupling film | 106.06 | 1.12 |
| Comparative Example 3-2 | Unannealed | 108.4 | 1.103 |
| | Exchange-coupling film | 108.2 | 1.104 |

As presented in Tables 5 and 6, the interplanar spacing of the exchange-coupling film of Example 3-1 fell between the interplanar spacing of the exchange-coupling film of Comparative Example 3-1 (PtCr) and the interplanar spacing of the exchange-coupling film of Comparative Example 3-2 (PtMn). This tendency was also observed in the unannealed multilayer structures (unannealed). These results strongly suggest the possibility that a ternary alloy of Pt—(Mn,Cr) was formed in the exchange-coupling film of Example 3-1. The interplanar spacings of all of the exchange-coupling films changed from those of the multilayer structures (unannealed) after annealing. Furthermore, the following relationship was present between the (111) interplanar spacings of Example 3-1 and Comparative Examples 3-1 (PtMn) and 3-2 (PtCr).

{(111)interplanar spacing of Example 3-1−(111)interplanar spacing of PtCr}/{(111)interplanar spacing of PtMn−(111)interplanar spacing of PtCr}=0.17

That is, the results indicate that when the difference 0.03 Å between the (111) interplanar spacing of PtMn and the (111) interplanar spacing of PtCr was 100%, the (111) interplanar spacing of Example 3-1 was 83% smaller than the (111) interplanar spacing of PtMn and was 17% larger than the (111) interplanar spacing of PtCr. An analysis of the results together with the Mn/Cr ratio of 0.19 determined by Auger electron spectroscopy strongly suggests the possibility that a ternary alloy of Pt—(Mn,Cr) was formed in the exchange-coupling film of Example 3-1.

For PtCr related to Comparative Example 3-1 and PtMn related to Comparative Example 3-2, an X-ray diffraction spectrum of a bulk of a disordered fcc structure and an X-ray diffraction spectrum of a bulk of an ordered $L1_0$ structure are known. The (111) interplanar spacing and the (222) interplanar spacing were calculated from these spectrum data to be as presented in Table 7. The interplanar spacings of Comparative Examples 3-1 and 3-2 were compared with these publicly known data. As a result, as presented in Table 7, in both Comparative Examples 3-1 and 3-2, the unannealed multilayer structures (unannealed) were highly likely to have a disordered fcc structure, and the exchange-coupling films obtained through annealing were highly likely to have an ordered $L1_0$ structure. Accordingly, also in Example 3-1, the unannealed multilayer structure (unannealed) probably had a disordered fcc structure, and the exchange-coupling film obtained through annealing probably had an ordered $L1_0$ structure.

TABLE 7

| | | Bulk structure | Plane | Interplanar spacing (Å) | Deviation with respect to bulk (%) | Average deviation (%) |
|---|---|---|---|---|---|---|
| Comparative Example 3-1 (PtMn) | Unannealed | Disordered fcc | (111) | 2.248 | 0.356 | 0.400 |
| | | | (222) | 1.124 | 0.445 | |
| | Exchange-coupling film | Ordered $L1_0$ | (111) | 2.240 | −0.089 | −0.045 |
| | | | (222) | 1.12 | 0.000 | |
| Comparative Example 3-2 (PtCr) | Unannealed | Disordered fcc | (111) | 2.208 | −0.136 | −0.113 |
| | | | (222) | 1.104 | −0.091 | |
| | Exchange-coupling film | Ordered $L1_0$ | (111) | 2.198 | 0.455 | 0.455 |
| | | | (222) | 1.099 | 0.455 | |

What is claimed is:

1. An exchange-coupling film comprising:
an antiferromagnetic layer; and
a pinned magnetic layer in contact with the antiferromagnetic layer,
wherein the antiferromagnetic layer has an alternating multilayer structure of three or more layers, the layers including alternately stacked $X^1$Cr and $X^2$Mn layers, where $X^1$ represents one or more elements selected from the group consisting of platinum group elements and Ni, and $X^2$ represents one or more elements selected from the group consisting of platinum group elements and Ni, and
wherein the antiferromagnetic layer includes a plurality of unit stacks, each comprising a unit of the $X^1$Cr and $X^2$Mn layer.

2. The exchange-coupling film according to claim 1, wherein $X^2$ is the same as $X^1$.

3. The exchange-coupling film according to claim 1, wherein $X^2$ is different from $X^1$.

4. The exchange-coupling film according to claim 1, wherein
$X^1$ is Pt, and
$X^2$ is Pt or Ir.

5. The exchange-coupling film according to claim 1, wherein the pinned magnetic layer has a self-pinned structure where a first magnetic layer, an intermediate layer, and a second magnetic layer are stacked.

6. The exchange-coupling film according to claim 1, wherein:
the $X^1$Cr layers in the unit stacks have the same film thickness,
the $X^2$Mn layers in the unit stacks have the same film thickness, and
the $X^1$Cr layers have a larger film thickness than the $X^2$Mn layers.

7. The exchange-coupling film according to claim 6, wherein a ratio of the film thickness of the $X^1$Cr layers to the film thickness of the $X^2$Mn layers is 5:1 to 100:1.

8. A magnetoresistive element comprising the exchange-coupling film according to claim 1 and a free magnetic layer that are stacked.

9. A magnetic detector comprising at least one magnetoresistive element according to claim 8.

10. The magnetic detector according to claim 9, wherein:
the at least one magnetoresistive element comprises a plurality of magnetoresistive elements on the same substrate, and
the plurality of magnetoresistive elements include a magnetoresistive element having a different pinned magnetization direction.

11. An exchange-coupling film comprising:
an antiferromagnetic layer; and
a pinned magnetic layer in contact with the antiferromagnetic layer,
wherein the antiferromagnetic layer includes an X(Cr-Mn) layer containing Mn, Cr, and one or more elements X selected from the group consisting of platinum group elements and Ni,
the antiferromagnetic layer has a first region closer to the pinned magnetic layer and a second region farther away from the pinned magnetic layer,
a Mn content in the first region is higher than a Mn content in the second region, and
Mn is contained in the entire second region.

12. The exchange-coupling film according to claim 11, wherein the first region is in contact with the pinned magnetic layer.

13. The exchange-coupling film according to claim 11, wherein a content of the element X in the antiferromagnetic layer is 30 at % or more.

14. An exchange-coupling film comprising:
an antiferromagnetic layer; and
a pinned magnetic layer in contact with the antiferromagnetic layer,
wherein the antiferromagnetic layer has an alternating multilayer structure of three or more layers, the layers including alternately stacked $X^1$Cr and $X^2$Mn layers, where $X^1$ represents one or more elements selected from the group consisting of platinum group elements and Ni, and $X^2$ represents one or more elements selected from the group consisting of platinum group elements and Ni, and
the $X^1$Cr layers have a larger film thickness than the $X^2$Mn layers.

15. An exchange-coupling film comprising:
an antiferromagnetic layer; and
a pinned magnetic layer in contact with the antiferromagnetic layer,
wherein the antiferromagnetic layer has an alternating multilayer structure of three or more layers, the layers including alternately stacked $X^1$Cr and $X^2$Mn layers, where $X^1$ represents one or more elements selected from the group consisting of platinum group elements and Ni, and $X^2$ represents one or more elements selected from the group consisting of platinum group elements and Ni, and
wherein in the exchange-coupling film, a normalized exchange-coupling magnetic field obtained by dividing an exchange-coupling magnetic field measured at 422° C. by an exchange-coupling magnetic field measured at 22° C. is 0.34 or greater.

16. An exchange-coupling film comprising:
an antiferromagnetic layer; and
a pinned magnetic layer in contact with the antiferromagnetic layer,
wherein the antiferromagnetic layer has an alternating multilayer structure of three or more layers, the layers including alternately stacked $X^1$Cr and $X^2$Mn layers, where $X^1$ represents one or more elements selected from the group consisting of platinum group elements and Ni, and $X^2$ represents one or more elements selected from the group consisting of platinum group elements and Ni, and
a $X^1$Cr layer is closest to the pinned magnetic layer.

* * * * *